(12) United States Patent
Li et al.

(10) Patent No.: US 11,628,993 B2
(45) Date of Patent: Apr. 18, 2023

(54) AUTOMATIC TRAY LOADING SYSTEM AND USE METHOD OF THE SAME

(71) Applicants: Qingdao University of Technology, Qingdao (CN); Ningbo Sanhan Alloy Material Co., Ltd., Ningbo (CN)

(72) Inventors: Changhe Li, Qingdao (CN); Yuying Yang, Qingdao (CN); Haogang Li, Qingdao (CN); Liang Luo, Qingdao (CN); Weixi Ji, Qingdao (CN); Binhui Wan, Qingdao (CN); Shuo Yin, Qingdao (CN); Huajun Cao, Qingdao (CN); Bingheng Lu, Qingdao (CN); Lizhi Tang, Qingdao (CN); Xin Cui, Qingdao (CN); Mingzheng Liu, Qingdao (CN); Yanbin Zhang, Qingdao (CN); Jie Xu, Qingdao (CN); Huiming Luo, Qingdao (CN); Haizhou Xu, Qingdao (CN); Min Yang, Qingdao (CN); Huaping Hong, Qingdao (CN); Teng Gao, Qingdao (CN); Wuxing Ma, Qingdao (CN); Shuai Chen, Qingdao (CN)

(73) Assignees: Qingdao University of Technology, Qingdao (CN); Ningbo Sanhan Alloy Material Co., Ltd., Ningbo (CN)

( * ) Notice: Subject to any disclaimer, the term of this patent is extended or adjusted under 35 U.S.C. 154(b) by 27 days.

(21) Appl. No.: 17/405,714

(22) Filed: Aug. 18, 2021

(65) Prior Publication Data
US 2022/0055844 A1   Feb. 24, 2022

(30) Foreign Application Priority Data

Aug. 19, 2020 (CN) .......................... 202010838634.X

(51) Int. Cl.
*B65D 71/70* (2006.01)
*B65G 61/00* (2006.01)
(Continued)

(52) U.S. Cl.
CPC .............. *B65D 71/70* (2013.01); *B65B 5/068* (2013.01); *B65G 61/00* (2013.01); *B65G 2201/0258* (2013.01); *H01L 21/67333* (2013.01)

(58) Field of Classification Search
CPC .... B65G 47/905; B65G 47/917; B65G 61/00; B65G 2201/0258; B65G 2203/042;
(Continued)

(56) References Cited

U.S. PATENT DOCUMENTS 4,850,104 A * 7/1989 Matrone ............ G05B 19/4189
29/829
5,772,387 A * 6/1998 Nakamura ............. G01R 31/01
414/404
(Continued)

Primary Examiner — Gregory W Adams
(74) Attorney, Agent, or Firm — M&B IP Analysts, LLC

(57) ABSTRACT

An automatic tray loading system and a use method of the same are provided, which includes a stacked tray assembly, including at least one tray which is stacked up, where the at least one tray is provided with several locating slots; a tray lifting platform which includes a tray supporting table being connected with a elevating mechanism; a tray pick and place platform having a working region covers a tray input module, where the tray pick and place platform includes a manipulator which is connected with a multidimensional motion mechanism; and a delivery table including a tray placement plate, where each of the tray placement plate is provided with a groove which is configured to place the at least one layer of trays, and each of the tray placement plates is connected with a linear driving mechanism.

9 Claims, 45 Drawing Sheets

(51) Int. Cl.
*B65B 5/06* (2006.01)
*H01L 21/673* (2006.01)

(58) Field of Classification Search
CPC ............. H01L 21/67333; B23P 19/001; B23Q 7/1431; H05K 13/02
See application file for complete search history.

(56) References Cited

U.S. PATENT DOCUMENTS

| | | | |
|---|---|---|---|
| 6,354,792 B1 * | 3/2002 | Kobayashi | H01L 21/67346 257/E23.179 |
| 6,524,052 B1 * | 2/2003 | Yamauchi | H05K 13/021 414/811 |
| 6,554,561 B2 * | 4/2003 | Jager | B23P 19/001 414/795.8 |
| 6,629,812 B1 * | 10/2003 | Lee | B65G 65/00 414/331.11 |
| 7,329,083 B2 * | 2/2008 | Nakazato | B65G 65/00 414/793 |
| 7,528,617 B2 * | 5/2009 | Cojocneanu | G01R 31/2887 324/756.07 |
| 7,562,923 B2 * | 7/2009 | Han | H05K 13/02 294/902 |
| 8,118,153 B2 * | 2/2012 | Yamasaki | G01N 35/028 198/346.2 |
| 2017/0113878 A1 * | 4/2017 | Kishimoto | B65G 57/04 |
| 2019/0076848 A1 * | 3/2019 | Belz | B01L 9/523 |

* cited by examiner

Partial view of a portion A
3 : 1

Partial view of a portion A
3:1

Partial view of a portion B
3:1

A-A

Partial view of a portion A
4:1

Partial view of a portion B
4:1

IV01  IV02  IV03  IV04    IV05      IV06

IV0101   IV0102    IV0103

IV0101  IV0102  IV0103
Partial view of a portion A
3:1

Partial view of a portion A

3:1

Partial view of a portion A
3:1

Partial view of a portion B
3:1

AUTOMATIC TRAY LOADING SYSTEM AND USE METHOD OF THE SAME

CROSS REFERENCE TO RELATED APPLICATION

This patent application claims the benefit and priority of Chinese Patent Application No. 202010838634.X, entitled "Automatic Tray Loading System and Use Method of the Same" filed on Aug. 19, 2020, the disclosure of which is incorporated by reference herein in its entirety as part of the present application.

TECHNICAL FIELD

The present disclosure relates to the technical field of industrial automation, and in particular to an automatic tray loading system and use method of the same.

BACKGROUND ART

The statements in this section merely provide background information related to the present disclosure, and do not necessarily constitute prior art.

The manufacturing industry is the pillar industry of national economy in today, and the development of manufacturing is an important indicator of a country's comprehensive strength. China is a large manufacturing country. At this stage, the machinery manufacturing in China mainly includes machine tool machining, and there is a great demand for machine tool cutters every year. In the use of all machine tool cutters, turning tools are the most widely used tools. Turning is also one of the most commonly used machining methods and is widely used. With the rapid development of the manufacturing industry in China, the demand for turning tools in the manufacturing field continues to increase. In a process of turning tool production, loading and unloading is a very important process. A traditional loading and unloading method in China is manual loading and unloading. After a machine tool completes a machining cycle, workers take away finished materials, then place blanks in the machine tool, and controls the machine tool to carry out machining. As the demand for turning tools continues to increase and the labor cost continues to increase, the traditional manual loading and unloading methods are time-consuming and laborious, which seriously hinders improvement of production efficiency and economic benefits. Even when workers are in close contact with the machine tool, personal safety issues are likely to occur by improper operations. Nowadays, with the improvement of an automation technology, the use of tray loading and unloading methods can solve the above problems to a certain extent, but there are also some new deficiencies.

Although an existing automatic loading and unloading production line can realize loading and unloading of workpieces on a machining center through machinery instead of labor to improve the work efficiency, if the specification of the workpieces machined by this set of production line changes, the model number of a current tray needs to be changed according to the specification of the workpiece, and the scope of application of the production line is narrow. Moreover, this production line adopts a long production line, which not only has high procurement and machining cost, but also greatly wastes the space. Although this set of production line can automatically complete the transportation and feeding of the materials, workers can only place or take away a single one at a time when placing and taking away the trays, which cannot save labor and labor time to the greatest extent.

Yang Jisheng, et al. of Xi'an Aeronautical Polytechnic Institute have invented a modular workpiece machining production line, which includes multiple machine tools. Each machine tool includes a lathe. One side of the lathe is provided with a stock bin which includes a stock bin frame. A tray bottom plate is arranged in the stock bin frame. A tray is placed in the tray bottom plate. A roll-over table is fixed at a top of the stock bin frame, and is provided with a roll-over device configured for rolling over a workpiece. The production line further includes a vertical column. The vertical column is movably connected with a mechanical arm configured for grabbing the workpiece in the stock bin, and is movably connected to the lathe. The stock bin, a robot and the lathe are integrated as an automatic machining unit, without on-site secondary assembly and adjustment operations, which can ensure the stability of the quality and performance of an automotive product.

Although this production line can integrate the stock bin, the robot and the lathe as the automatic machining unit to ensure the stability of the quality and performance of the automotive product, a position between the stock bin and the robot is close. When the materials in the stock bin need to be replaced manually, workers are closer to the machining center and the robot, which easily leads to personal safety issues. In addition, multiple lathes require multiple stock bins to supply materials. The more the lathes, the greater the workload of the workers, which cannot realize automation of the production line to the greatest extent.

(1) In the current machining industry, due to the limitation to the labor capacity of the workers, the labor intensity is high. When one tray is full, the tray needs to be replaced manually, and a worker can only operate a single tray at a time. Moreover, during replacement of the tray, the production line needs to be stopped, which increases the time for loading and unloading, especially loading, and limits the automation degree of the production line. Multiple artificial interventions in loading is required, leading to high workload.

(2) The number of trays input and output by the production line at a time cannot be changed with the change of an order quantity.

(3) The existing automatic tray loading and unloading systems, especially loading systems, mostly use long assembly lines. Structure of this assembly line not only has high procurement and processing cost, but also greatly wastes the space.

(4) The tray cannot reliably carry materials of different specifications. When the specifications of the materials that need to be carried change, the tray needs to be replaced accordingly, so the applicability of the tray is not high.

SUMMARY

For the deficiencies in the prior art, the embodiments aim to provide an automatic tray loading system which can realize high degree of automation to free workers from a production process, improve the production efficiency and reduce the labor intensity of the workers. Moreover, the workers can flexibly adjust, according to an order change, the number of trays input and output by a production line at a time. When the model numbers of materials to be conveyed change, a tray can reliably locate materials with different model numbers to ensure reliability of a material transportation process. Loading and unloading systems are compact in structure to avoid space waste.

In order to achieve the foregoing purpose, the present disclosure is realized by the following technical solution.

An automatic tray loading system includes:

a stacked tray assembly, comprising at least one tray which is stacked up, and the at least one tray being provided with several material slots which are configured to limit positions of materials;

a tray lifting platform, comprising a first tray supporting table which is configured to support the stacked tray assembly and the first tray supporting table being connected with a first elevating mechanism;

a delivery table, comprising tray placement plates, each of the tray placement plates being provided with a first groove which is configured to place the at least one tray, and each of the tray placement plates being connected with a linear driving mechanism; and a tray pick and place platform, being supported by a frame and having a working region covers the tray lifting platform and the delivery table, the tray pick and place platform comprising a manipulator which is connected with a multi-dimensional motion mechanism and is opened or closed to realize grabbing and releasing of the at least one tray.

In the above-mentioned loading system, the stacked tray assembly may realize stack-up of multiple trays and may load the multiple trays at the same time, which improves the loading efficiency. The tray lifting platform realizes lifting of the trays in the stacked tray assembly, thereby realizing that the tray pick and place platform conveys the trays on the tray lifting platform to the delivery table.

According to the above-mentioned automatic tray loading system, the first elevating mechanism may be a ball screw mechanism and may be fixed on a first rear supporting plate. The first tray supporting table may be connected with a sliding block in the ball screw mechanism by a connecting plate. An inner side of the first tray supporting table may be provided with a first distance sensor connected with a computer. And the distance sensor may be disposed in a manner of facing the inner side of the first tray supporting table to detect whether the at least one tray completely reach the first tray supporting table.

A first elongated hole may be provided in a width direction of the first tray supporting table. A belt auxiliary module may be arranged at the first elongated hole, and an upper surface of the belt auxiliary module may be higher than an upper surface of the first tray supporting plate and may be in direct contact with a bottom surface of the tray to reduce a friction force generated by the stacked tray assembly moving to the first tray supporting table and further provide power for inputting of the stacked tray assembly.

Two limit sensors at different heights may be arranged at a side part of the first rear supporting plate and may be connected with the computer. A first trigger sheet may be arranged at a side part of the first tray supporting table. and a position of the first trigger sheet may be detected by the two limit sensors to control the tray lifting platform to realize feeding.

In order to realize unloading, the above-mentioned automatic tray loading system further may include a tray lowering platform which may be arranged on one side of the tray lifting platform. A structure of the tray lowering platform may include a second tray supporting table. A second elevating mechanism may be connected with the second tray supporting table and may be mounted on a second rear supporting plate. A surface of the second tray supporting table may be provided with a clamping slot. Two sides of a bottom of a push plate may pass through the clamping slot and may be connected with a T-shaped plate. A moving mechanism may be connected with the T-shaped plate. A fixed sliding block may be provided on each of two sides of an upper surface of the T-shaped plate and is fixed with a guide rail mounted on the second tray supporting table. A first proximity sensor may be embedded to a surface of the moving mechanism. The moving mechanism may be connected with the computer and may be controlled by the computer. A first proximity sensor may be connected with the computer to transmit position information of the push plate to the computer. Multiple first proximity sensors which may be magnetic proximity sensors may be provided on an outer side of the moving mechanism; and the moving mechanism may be a rodless cylinder sliding table.

A second elongated hole may be provided in a width direction of the second tray supporting table. An anti-friction belt module may be arranged at the second elongated hole, and an upper surface of the anti-friction belt module may be higher than an upper surface of the second tray supporting plate. And the upper surface of the anti-friction belt module may be in direct contact with a bottom surface of the tray to reduce a friction force generated by the stacked tray assembly moving to the second tray supporting table.

Three limit sensors at different heights may be arranged at a side part of the second rear supporting plate of the tray lowering platform and may be connected with the computer. The limit sensors at a top and a bottom of the side part of the second rear supporting plate may be configured to acquire a position signal of the second tray supporting table for the computer, so as to control the tray lowering platform to realize delivery. The limit sensor at a middle of the side part of the second rear supporting plate may have a changeable installation height on the second rear supporting plate, and may be configured to detect whether to start to discharge the materials. After the second tray supporting table reaches the limit sensor at the middle, it can be determined to start to discharge materials, that is, the trays are lowered to a height of the tray output module for discharging. A number of the at least one tray output from the automatic feeding system at a time may be controlled by changing the installation height of the limit sensor at the middle of the side part of the second rear supporting plate. And a second trigger sheet may be arranged at a side part of the second tray supporting table.

The limit sensors are U-shaped photoelectric sensors. The corresponding trigger sheets may move to middle parts of the U-shaped photoelectric sensors so that the limit sensors send signals to the computer.

According to the above-mentioned automatic tray loading system further may include a tray input and output platform; the tray input and output platform includes a tray input module configured to input the stacked tray assembly and a tray output module configured to output the stacked tray assembly. The tray input module and the tray output module may be disposed at the same height. The tray input module may be provided on one side of the tray output module. The tray input module may be arranged at the side of the tray lifting platform, and the tray output module may be arranged on the side of the tray lowering platform. A second distance sensor may be configured to detect whether the stacked tray assembly is completely output may be arranged at a side part of the tray output module. And the distance sensor may be connected with the computer.

According to the above-mentioned automatic tray loading system, the tray input and output platform further may include a box-shaped frame body which may be divided into two regions. One of the two regions may be configured to support the tray input module, and an other of the two regions may be configured to support the tray output module. An upper surface of the box-shaped frame body may be provided with two openings. The tray lifting platform and the tray lowering platform may respectively protrude from the two openings. A third distance sensor facing the tray lifting platform may be arranged at one of the two openings, and two fourth distance sensors with different heights and facing the tray lowering platform may be arranged at an other of the two openings. One of the two fourth distance sensors at a relatively low position may be configured to detect whether an entity capable of supporting the at least one tray to be landed exists in front of the distance sensor. After the fourth distance sensor at a relatively high position may detect that the tray lowering platform has a tray, the computer may control the tray lowering platform to drop down. After the third distance sensor at a side of the tray lifting platform may detect that there is no tray. The computer may control the tray lifting platform to rise. All distance sensors may be connected with the computer. The computer may be connected with the multi-dimensional motion mechanism to control unstacking and stacking of the trays. And the computer may be separately connected with the tray input module and the tray output module respectively. Both of the tray input module and the tray output module may be belt conveying mechanisms to form a belt input module and a belt output module. A set distance may be reserved between an upper surface of the belt conveying mechanism and an upper surface of the frame body to facilitate inputting and outputting of the trays.

The above-mentioned distance sensors may be all diffuse reflection sensors which process information reflected from a surface of a tray layer and transmit a signal to the computer.

According to the above-mentioned automatic tray loading system, an upper surface of the at least one tray may be provided with at least one locating block, and a lower surface of the at least one tray may be provided with at least one locating slot matching a locating block of a next tray. A height of the at least one locating block may be less than a depth of the at least one locating slot, and a length of the locating at least one block may be less than a length of the at least one locating slot. An inner side part of a material slot may be steplike to adapt to the materials with different sizes. And a grabbing slot for grabbing by the manipulator may be provided at a side part of the at least one tray.

According to the above-mentioned automatic tray loading system, the manipulator may include a mounting plate which may be provided with a third linear sliding rail. A bidirectional moving mechanism may be provided through the mounting plate. Two ends of the bidirectional moving mechanism may be connected with hooks which may be connected with a third sliding block arranged on the third linear sliding rail. The at least one tray may be supported by the hooks at the two ends. A second proximity sensor may be embedded to a surface of the bidirectional moving mechanism and may be connected with the computer to detect an opened or closed state of the manipulator. Multiple second proximity sensors which may be magnetic proximity sensors may be provided on an outer side surface of the bidirectional moving mechanism relative to the mounting plate.

Further, each hook may have a second groove so that each of the hooks may be a grooved hook. The second groove of the grooved hook may be disposed facing the bidirectional moving mechanism. The second groove in the grooved hook may be configured to cooperate with the grabbing slot on the side edge of the tray. The bidirectional moving mechanism may be a two-guide-rod cylinder. The two-guide-rod cylinder drives the hooks on to sides to move to realize grabbing and releasing of the tray.

According to the above-mentioned automatic feeding system of a tray, the multidimensional moving mechanism may include X-axis directional displacement modules which may be arranged on two sides of the retainer. A Y-axis directional displacement module may be supported by the X-axis directional displacement modules on two sides. A Z-axis directional displacement module may be supported by the Y-axis directional displacement module and may pass through the Y-axis directional displacement module. And the manipulator may be arranged below the Y-axis directional displacement module.

A structure of the X-axis directional displacement module may be same as a structure of the Y-axis directional displacement module, each of which may include a linear sliding rail which may be provided with a sliding block. A rack may be connected with a power piece and may be fixed, to drive the sliding block by the power piece to move along the linear sliding rail. And corresponding power piece may be fixed to the Y-axis directional displacement module and the Z-axis directional displacement module.

The Z-axis directional displacement module may include a telescopic piece which may pass through a cylinder mounting plate and may be provided with a connecting block. And the connecting block may be connected with the manipulator.

An outer side of the telescopic piece may be provided with a plurality of third proximity sensors having different heights and configured to confirm an extending position of the telescopic piece, and the third proximity sensors may be connected with the computer. And the telescopic piece may be a cylinder.

According to the above-mentioned automatic tray loading system, the delivery table may be a double layer delivery table, and may include two layers of the tray placement plates arranged on a table main body. A first groove may be formed in each of the tray placement plates. A shape of the first groove may be consistent with a shape of the tray and can play a good locating and carrying role for the tray. Furthermore, the two layers of tray placement plates may move in a dislocation manner. The table main body may be connected with the tray placement plates by the linear driving mechanism. fourth proximity sensors connected with the computer may be arranged at two extreme positions on a lateral side of each linear driving mechanism to transmit position information of the trays in the tray placement plates to the computer in time. The linear driving mechanism may be rodless cylinder sliding table.

Or, a robot configured to transport the materials in the at least one tray in the delivery table is arranged on an other side of the delivery table relative to the tray lifting platform. The robot may be the prior art, and may transport blank materials in the trays in the delivery table to other working positions. A control center of the robot may be connected with the computer. And finished materials machined by other workbenches can also be transported into the tray in the delivery table.

A use method of the automatic tray loading system is provided, which includes the following contents:

detecting by the computer whether a tray pick and place platform has replaced at least one tray containing finished materials in a B-layer tray placement plate of the two tray placement plates that is previously pushed out with at least one tray containing blank materials, after the blank materials in a A-layer tray placement plate of the two tray placement plates in the delivery table are replaced with the finished materials; waiting until the replacement is completed; and pushing out the A-layer tray placement plate having the finished materials by the computer after the replacement is completed;

pulling back the B-layer tray placement plate having the blank materials by the computer after the A-layer tray placement plate is pushed in place; controlling by the computer the robot to operate the blank materials, after the at least one tray containing the blank materials is pulled back to a specified position, and a new batch of blank material is in position;

performing a tray replacement process on the A-layer tray placement plate by the tray pick and place platform; grabbing the at least one tray containing the finished materials on the A-layer tray placement plate by the tray pick and place platform; detecting by the computer whether the second tray supporting table in the tray lowering platform is in place, if no, waiting until the second tray supporting table is in place, and if yes, stacking the at least one tray containing the finished materials onto the tray lowering platform;

controlling, by the computer, the tray pick and place platform to unstack a single tray containing blank materials from the tray lifting platform, transporting the single tray containing the blank materials to tray placement plate of an A-layer tray push-pull module, and sending a signal to the robot that the tray replacement process has completed;

pushing out the B-layer tray placement plate having finished material, after the blank materials on the B-layer tray placement plate are replaced with the finished materials by the robot; pulling back the A-layer tray placement plate having the blank materials for continuing to operate, and performing the tray replacement process on the at least one tray on the B-layer tray placement plate by the tray pick and place platform, repeating above operation;

lowering the first tray supporting table to start feeding, after all trays containing the blank materials on the tray lifting platform are grabbed; inputting a new batch of stacked tray assembly with blank materials to the tray lifting platform, lifting the first tray supporting table to an first original position after the feeding is completed, and sending a feeding completion signal to the computer; and lowering the second tray supporting table to start feeding, after a predetermined number of trays containing the finished materials are stacked on the tray lowering platform, delivering a stacked tray assembly with the finished materials, lifting the second tray supporting table to a second original position after the delivery is completed, and sending a delivery completion signal to the computer.

An order of stations that the trays flow by is: the tray input and output platform, the tray lifting platform, the tray pick and place platform, the double layer delivery table, the tray pick and place platform, the tray lowering platform, and the tray input and output platform.

The embodiments have the following beneficial effects.

(1) The tray can reliably carry materials of different specifications and has a wide application range.

(2) The loading system is highly automatic, so that human is freed from a production process to the largest extent to reduce unnecessary manual intervention time. In the whole production process, a worker only needs to place the stacked tray assembly with the blank materials onto the belt input module and takes away the stacked tray assembly with the finished materials from the belt output module. The worker can operate multiple trays at a time, so that the manual intervention frequency is reduced, and the manual intervention efficiency is improved.

(3) According to the loading system, when the worker places and takes away materials, the worker is away from equipment such as the machining center and the robot that may cause potential safety hazard during operation, so that the safety of an operation environment of the worker is improved.

(4) According to the arrangement of the limit sensors, the loading system can realize adjusting the number of trays of a one-time input and output production line according to different order requirements, which is higher in applicability, and meets different production needs.

(5) For the loading system, all the parts are mainly arranged in an embedded way, so that the space is compact, and the space utilization rate is high.

BRIEF DESCRIPTION OF THE DRAWINGS

The accompanying drawings constituting one part of the present disclosure are used to provide a further understanding of the present disclosure, and the exemplary embodiments and descriptions of the present disclosure are used to explain the present disclosure, and are not intended to limit the present disclosure.

Figure 1:
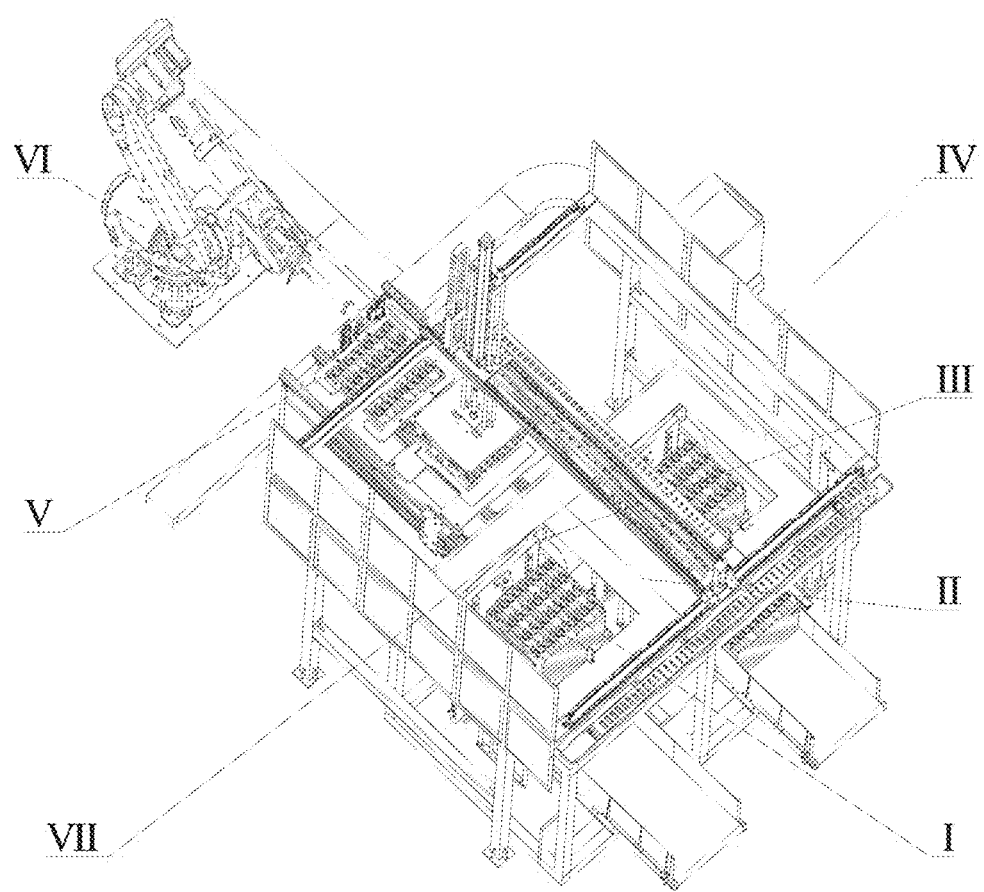
FIG. 1 is an axonometric view of an automatic tray loading system.

List of the reference characters: I stacked tray assembly; II tray input and output platform; III tray lifting platform; IV tray pick and place platform; V double layer delivery platform; VI robot; and VII tray lowering platform;

I01 tray; I02 cutter material; I0101 first locating block; I0102 first material slot; I0103 second material slot; I0104 third material slot; I0105 grabbing slot; I0106 second locating block; I0107 first locating slot; and I0108 second locating slot;

II01 diffuse reflection sensor; II02 belt input module; II03 diffuse reflection sensor; II04 diffuse reflection sensor; II05 belt output module; and II06 diffuse reflection sensor;

III01 stepping motor; III02 lower fixing plate; III03 hexagon socket head screw; III04 ball screw module; III05 first trigger sheet; III06 hexagonal flange tapping screw; III07 hexagon socket head screw; III08 first guide rod; III09 hexagon socket head screw; III10 first tray supporting table; III11 retainer; III12 hexagon socket head screw; III13 hexagon socket head screw; III14 lifting connecting plate; III15 lifting sliding block; III16 hexagon socket head screw; III 17 hexagon socket head screw; III18 lifting guide rail; III19 hexagonal flange tapping screw; III20 Ushaped photoelectric sensor; III21 first rear supporting plate; III22 hexagon flange tapping screw; III23 Ushaped photoelectric sensor;

IV01 retainer; IV02 Yaxis directional displacement module; IV03 manipulator;

IV04 hexagon socket head screw; IV05 hexagon socket head screw; and IV06 Zaxis directional displacement module;

V01 hexagon flange tapping screw; V02 upper layer tray push-pull module; V03 table main body; V04 hexagon socket head screw; V04 hexagon flange tapping screw; V05 lower layer tray push-pull module;

VII01 ball screw module; VII02 second rear supporting plate; VII03 U-shaped photoelectric sensor; VII04 lowering connecting plate; VII05 second trigger sheet; VII06 U-shaped photoelectric sensor; VII07 stepping motor; VII08 U-shaped photoelectric sensor; VII09 hexagon socket head screw; VII10 hexagon socket head screw; VII11 second tray supporting table;

III1001 sensor retainer; III1002 hexagon socket head screw; III1003 first tray supporting plate; III1004 transitional strengthening block; III1005 lateral triangular supporting plate; III1006 belt auxiliary module; III1007 hexagon socket head screw; III1008 drag chain connecting sheet; III1009 hexagon socket screw; III1010 hexagon socket screw; III1011 hexagon socket screw; III1012 diffuse reflection sensor; III1013 hexagon socket screw; III1014 hexagon flange tapping screw;

IV0101 first rack; IV0102 first sliding block; IV0103 first linear guide rail; IV0201 second sliding block; IV0202 the second linear guide rail; IV0203 second rack; IV0204 second gear motor; IV0301 third linear sliding rail; IV0302 hexagon socket head screw; IV 0303 mounting plate; IV0304 third sliding block; IV0305 first Lshaped connecting plate; IV0306 hexagon socket head screw; IV0307 second Lshaped connecting plate; IV0308 hexagon socket head screw; IV0309 grooved hook; IV030901 locating groove; IV0310 double guide rod cylinder; IV0311 hexagon socket head screw; IV0312 hexagon socket head screw; IV0313 hexagon socket head screw; IV0601 connecting block; IV0602 cylinder mounting plate; IV0603 hexagon flange tapping screw; IV0604 third gear motor; IV0605 magnetic proximity sensor; IV0606 magnetic proximity sensor; IV 0607 guide rod; IV0608 cylinder; IV0609 magnetic proximity sensor; IV0610 guide rod retainer; and IV0611 magnetic proximity sensor;

V0201 upper layer tray placement plate; V0202 extended connecting block; V0203 magnetic proximity sensor; V0204 first rodless cylinder sliding table; V02 05 hexagon socket head screw; V0206 third L-shaped connecting plate; V0207 hexagon socket head screw; V0208 magnetic proximity sensor; V0209 fourth L-shaped connecting plate; V0210 hexagon socket head screw; V0211 sliding block; V0212 connecting block; V0213 hexagon socket head screw; V0214 hexagon socket head screw; V0301 table linear guide rail; V0302 cylinder buffer; V0501 hexagon socket head screw; V0502 hexagon socket head screw; V0503 connecting block; V0504 sliding block; V0505 magnetic proximity sensor; V0506 hexagon flange tapping screw; V0507 hexagonal nut; V0508 first connecting plate; V0509 second connecting plate; V0510 second rodless cylinder sliding table; V0511 magnetic proximity sensor; V0512 lower layer tray placement plate; V0513 hexagon flange bolt; V0514 hexagon flange tapping screw;

VII1101 push plate; VII1102 hexagon socket head screw; VII1103 triangular connecting block; VII1104 hexagon socket head screw; VII1105 second tray supporting plate; VII1106 lateral triangular fixed plate; VII1107 push sliding block; VII1108 hexagon socket head screw; VII1109 hexagon socket head screw; VII1110 hexagon socket head screw; VII1111 triangular table; VII1112 rodless cylinder sliding table; VII1113 hexagon socket head screw; VII1114 T-shaped plate; VII1115 anti-friction belt module; VII1116 push guide rail; VII1117 transitional straightening block; VII1118 hexagon socket head screw; VII1119 hexagon socket head screw; VII1120 hexagon socket head screw;

IV031001 magnetic proximity sensor; IV031002 magnetic proximity sensor; and

VII111201 magnetic proximity sensor; and VII111202 magnetic proximity sensor.

DETAILED DESCRIPTION OF THE EMBODIMENTS

It should be noted that the following detailed descriptions are all exemplary and are intended to provide a further understanding of the present disclosure. Unless otherwise specified, all technical and scientific terms used in the present disclosure have the same meaning as commonly understood by a person of ordinary skill in the art to which the present disclosure belongs.

It should be noted that terms used herein are only for describing specific embodiments and are not intended to limit exemplary embodiments according to the present disclosure. As used herein, the singular form is intended to include the plural form, unless the present disclosure clearly indicates otherwise. In addition, it should further be understood that terms "include" and/or "including" used in the present specification indicate that there are features, steps, operations, devices, assemblies, and/or combinations thereof.

For convenience of description, the words "above", "below", "left", and "right" appearing in the present disclosure only indicate directions consistent with those of the accompanying drawings, are not intended to limit the structure, and are used only for ease and brevity of illustration and description of the present disclosure, rather than indicating or implying that the mentioned device or element needs to have a particular orientation or needs to be constructed and operated in a particular orientation. Therefore, such terms should not be construed as a limitation on the present disclosure.

For a part of terms explanation, terms in the present disclosure such as "mount", "connect", "connection", and "fix" should be understood in a broad sense. For example, the connection may be a fixed connection, a detachable connection, or an integral connection; and may be a direct connection, an indirect connection by using an intermediate medium, an interior connection between two components, or interaction between two components. A person of ordinary skill in the art may understand specific meanings of the foregoing terms in the present disclosure according to a specific situation.

As described in the background, there are problems in the prior art that the workload of manual loading is high and the production is affected. In order to solve the above technical problems, the present disclosure provides an automatic tray loading system.

Figure 1A:
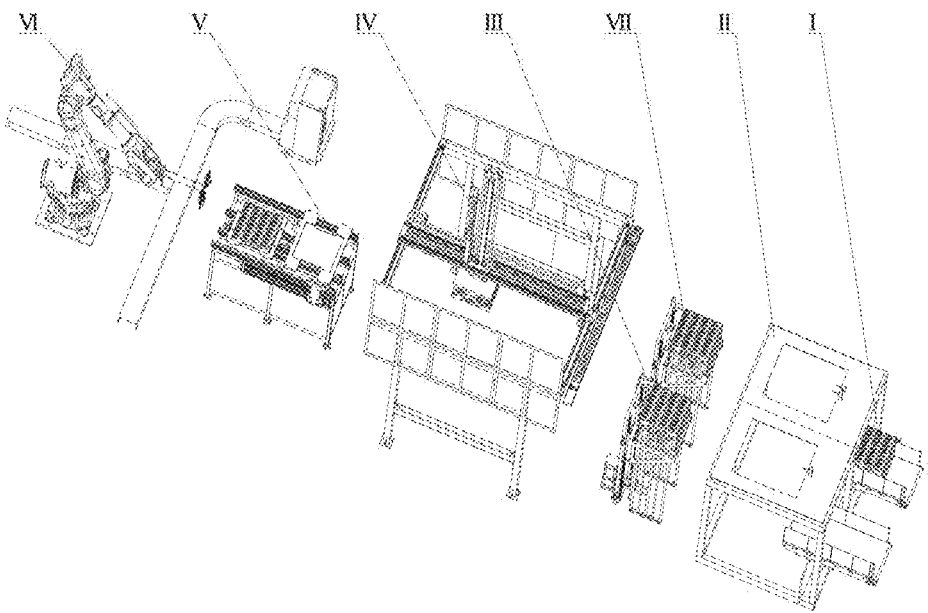
FIG. 1(a) is an exploded view of the automatic tray loading system.

In one typical embodiment of the present disclosure, referring to FIG. 1 and FIG. 1(a), an automatic tray loading and unloading system includes a stacked tray assembly I, a tray input and output platform II, a tray lifting platform III, a tray pick and place platform IV, a double layer delivery table V, a robot VI, and a tray lowering platform VII. Power pieces in the various mechanisms are separately connected with a computer. Where the tray lifting platform III and the tray lowering platform VII are embedded to the tray input and output platform II. The double layer delivery table V is arranged behind the tray input and output platform II. The tray pick and place platform IV is arranged above the tray input and output platform II and the double layer delivery table V. Trays are picked and placed by the tray pick and place platform IV to exchange trays among the double layer delivery table V, the tray lifting platform III and the tray lowering platform VII. The robot VI is placed behind the double layer delivery table V. Materials are picked and placed by the robot VI to realize replacement between blank materials and finished materials on the trays.

Specifically, the stacked tray assembly I is configured for carrying different types of cutter materials. The tray input and output platform II is configured for inputting and outputting the stacked tray assembly and controlling the tray pick and place platform to realize unstacking and stacking. The tray lifting platform III is configured for feeding trays and lifting blank material trays to a position to be picked. The tray pick and place platform IV is configured for unstacking and stacking and replaceing the trays. The double layer delivery table V is configured for supplying materials to the robot. The robot VI is configured for picking blank materials on a main tray of the double layer delivery table to a rear production line for machining, and then placing machined finished materials back to original positions of the trays to replace the blank materials in the trays with the finished materials. And the tray lowering platform VII is configured for providing a landing position and discharging the trays with finished materials.

Figure 2:
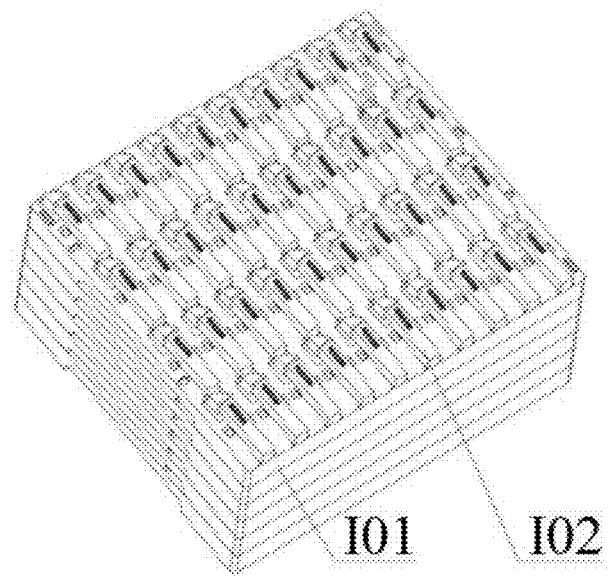
FIG. 2 is an axonometric view of a stacked tray assembly.
Figure 2A:
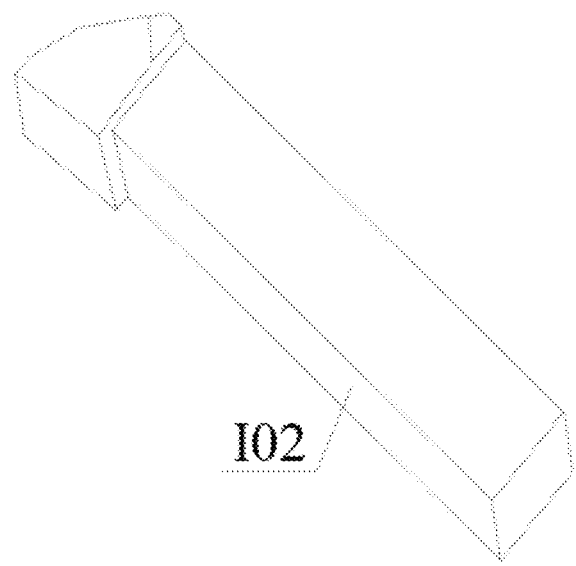
FIG. 2(a) is an axonometric drawing of a cutter material.
Figure 2B:
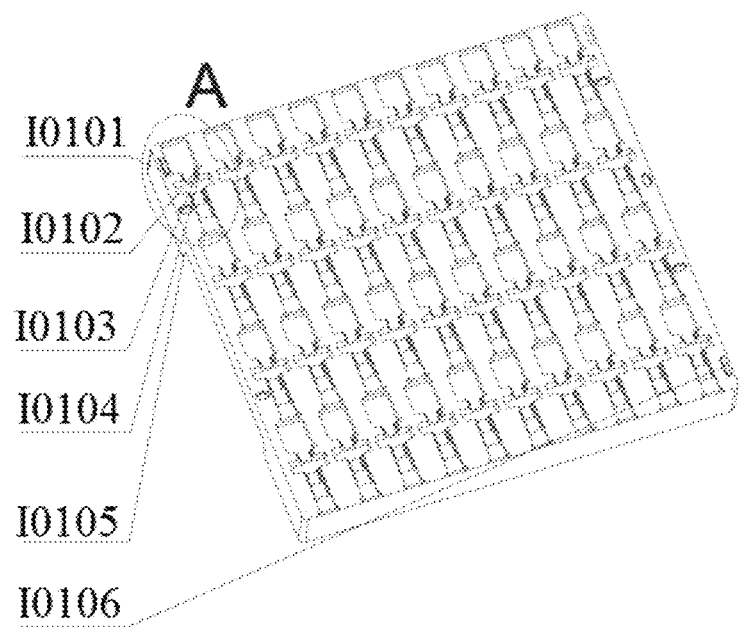
FIG. 2(b) is an axonometric view 1 of a tray.
Figure 2C:
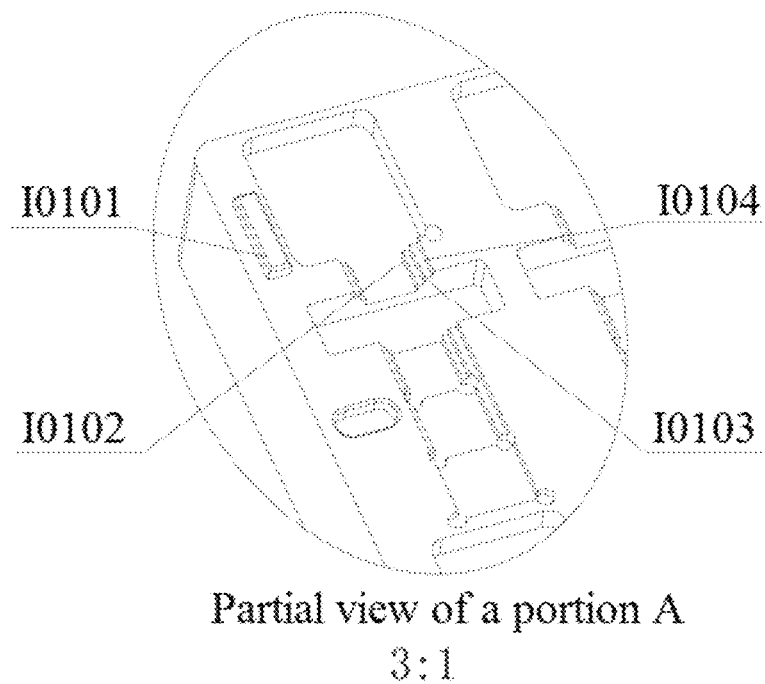
FIG. 2(c) is a partially enlarged view of a portion A in FIG. 2(b)
Figure 2D:
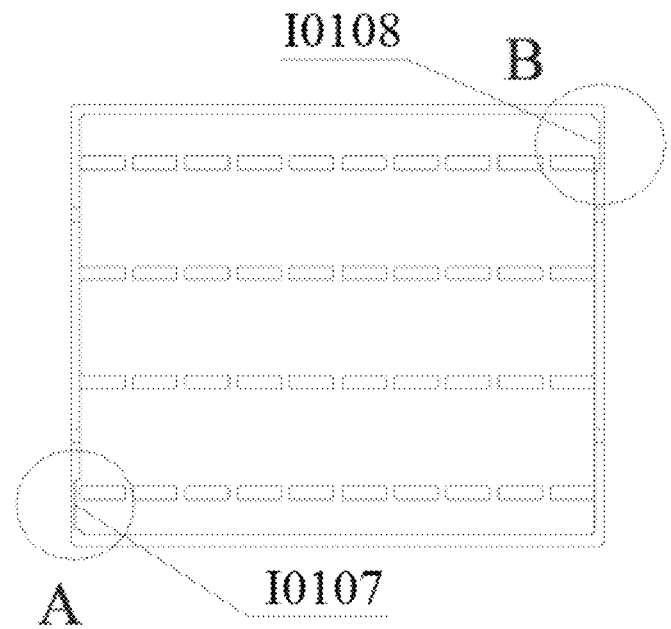
FIG. 2(d) is an axonometric view of the tray.
Figure 2E:
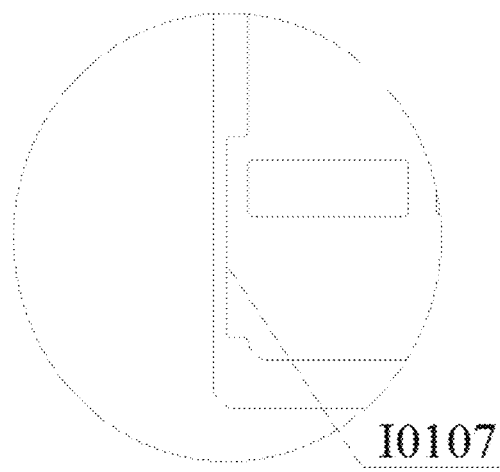
FIG. 2(e) is a partially enlarged view of a portion A in FIG. 2(d)
Figure 2F:
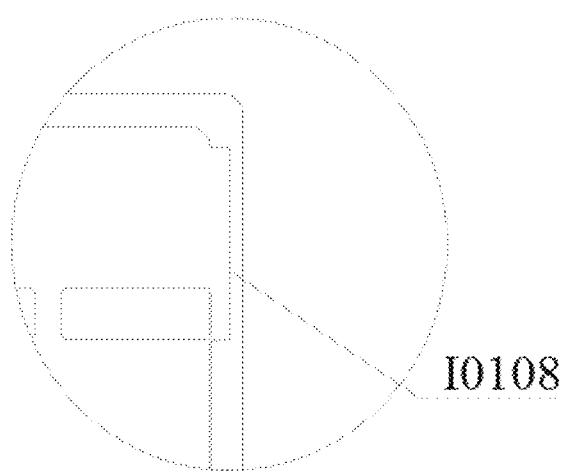
FIG. 2(f) is a partially enlarged view of a portion B in FIG. 2(d)
Figure 2G:
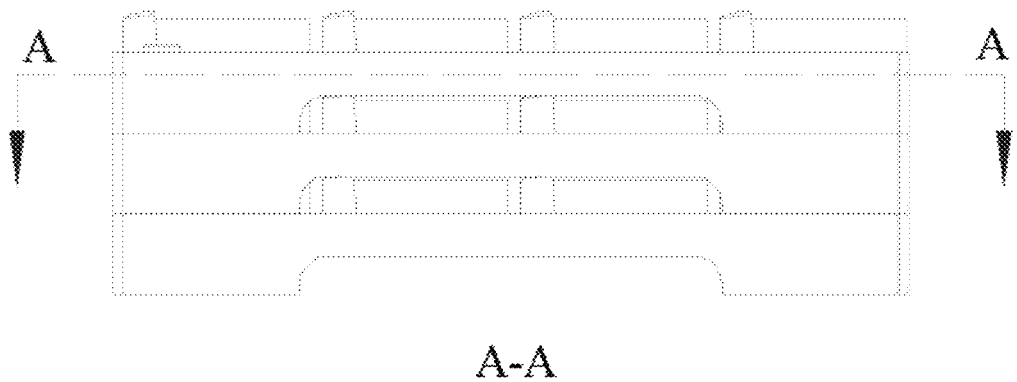
FIG. 2(g) is a side view of the stacked tray assembly.
Figure 2H:
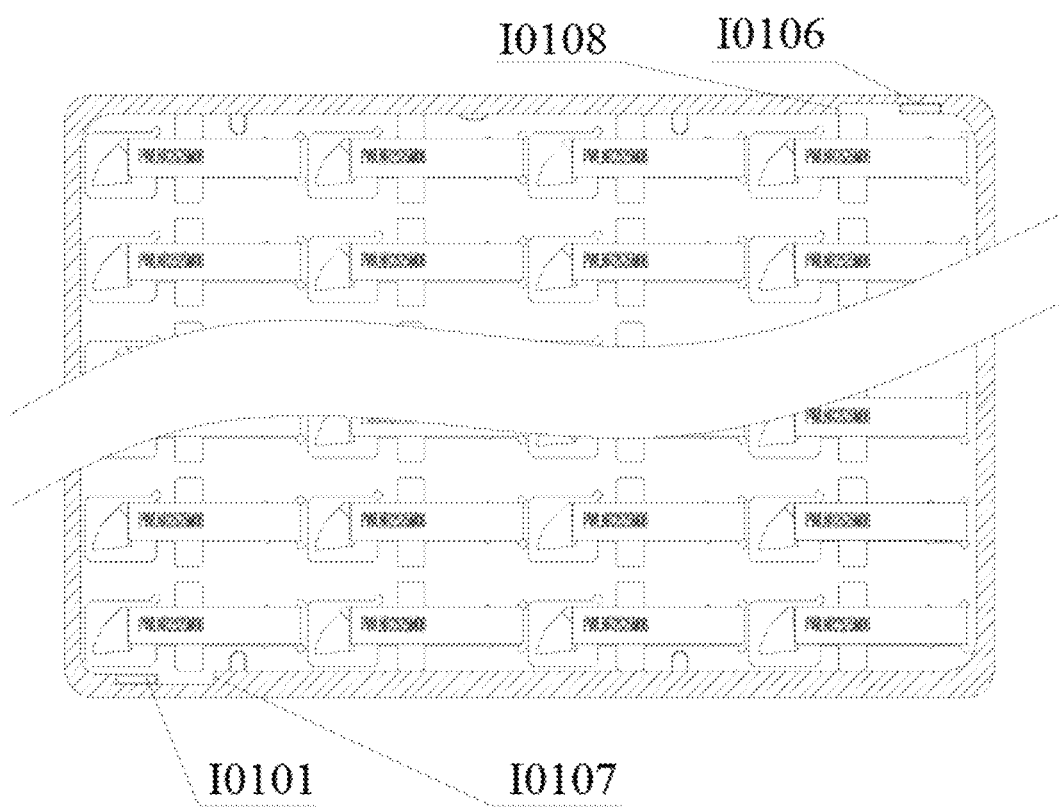
FIG. 2(h) is a cross-sectional view of the stacked tray assembly taken along the section A-A of FIG. 2(g)

Referring to FIG. 2 to FIG. 2(h), the stacked tray assembly I is formed by stacking multiple trays I01. The first locating block I0101 and the second locating block I0106 are machined on the tray I01 and are distributed along a diagonal of the tray I01. A first locating slot I0107 and a second locating slot I0108 are machined below the tray I01, and one of the two locating slots is located below the first locating block I0101, and the other locating slot is located below the second locating block I0106. During stacking, by means of the cooperation between the locating blocks in an upper tray and the locating slots of a lower tray, dumping or scattering and so on of the stacked tray assembly in a transportation or stacking process are avoided, and the stability of the stacked tray assembly in the transportation or stacking process is improved. The height of the locating block is less than the depth of the locating slot, and the length of the locating block is less than the length of the locating slot, which can alleviate the situation that upper and lower trays cannot be assembled smoothly due to a machining error of the locating blocks or the locating slots of a single tray.

There are multiple material slots machined in the tray I01, and grabbing slots I0105 are machined on two sides of the tray. The size of the grabbing slot matches the size of a locating groove IV030901 of a grooved hook IV0309 in a manipulator IV03, which can improve the reliability and the stability of the manipulator during grabbing and transportation of the tray. In order to adapt to different types of materials, a first material slot I0102, a second material slot I0103, and a third material slot I0104 are provided in each of the various material slots from inside to outside, and the three material slots are in stepped distribution, so that widths of the three material slots at positions for setting the material slots gradually increase from inside to outside. Each locating slot may completely restrict six spatial freedom degrees of a corresponding cutter material, and the tray may reliably carry various types of cutter materials.

Figure 3:
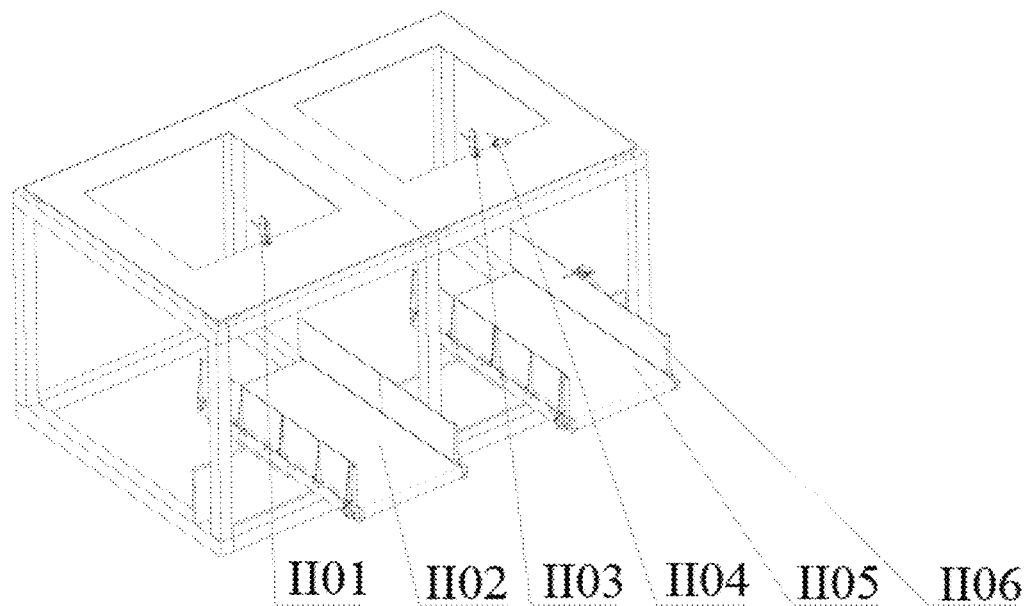
FIG. 3 is an axonometric view of a tray input and output platform.
Figure 3A:
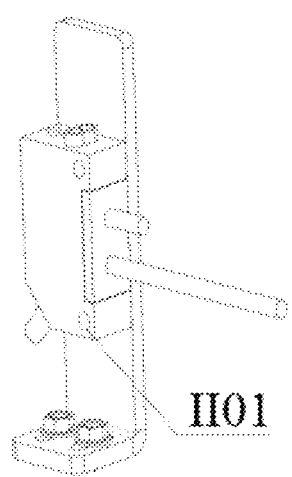
FIG. 3(a) is an axonometric view of a diffuse reflection sensor.
Figure 3B:
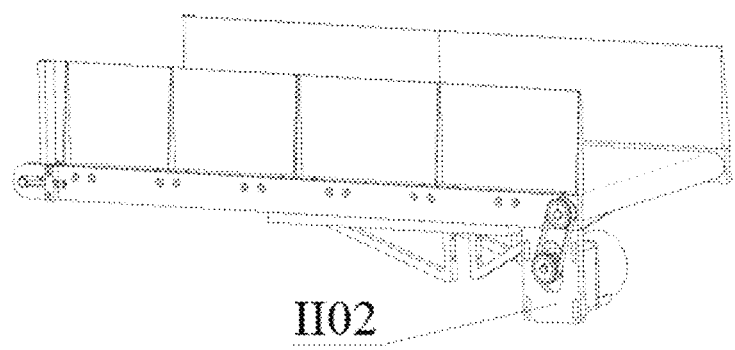
FIG. 3(b) is an axonometric view of a belt input module.

Referring to FIG. 3 to FIG. 3(b), the tray input and output platform II includes a box-shaped frame body, which is divided into two regions. One region is configured to input the trays, and the other region is configured to output the trays. A belt input module II02 and a belt output module II05 are arranged through the frame body at a lower part of the tray input and output platform. Two openings are provided on an upper surface of the frame body of the tray input and output platform II. One of the openings is provided with a diffuse reflection sensor II01, and the other opening is provided with a diffuse reflection sensor II03 and a diffuse reflection sensor II04. The three sensors are mounted on the tray input and output platform II by screws. A diffuse reflection sensor II06 is fixed on a side of the belt output module II05 by screws, and is configured to detect whether the stacked tray assembly is completely output.

It needs to be explained that the diffuse reflection sensor is a distance sensor, which can be configured to determine the presence or absence of materials and transmit information to a computer. The computer analyzes a signal transmitted by the distance sensors and controls the system to realize unstacking and stacking. The belt input module II02 and the belt output module II05 which are arranged below the tray input and output platform realize inputting and outputting of the stacked tray assembly I.

Figure 4:
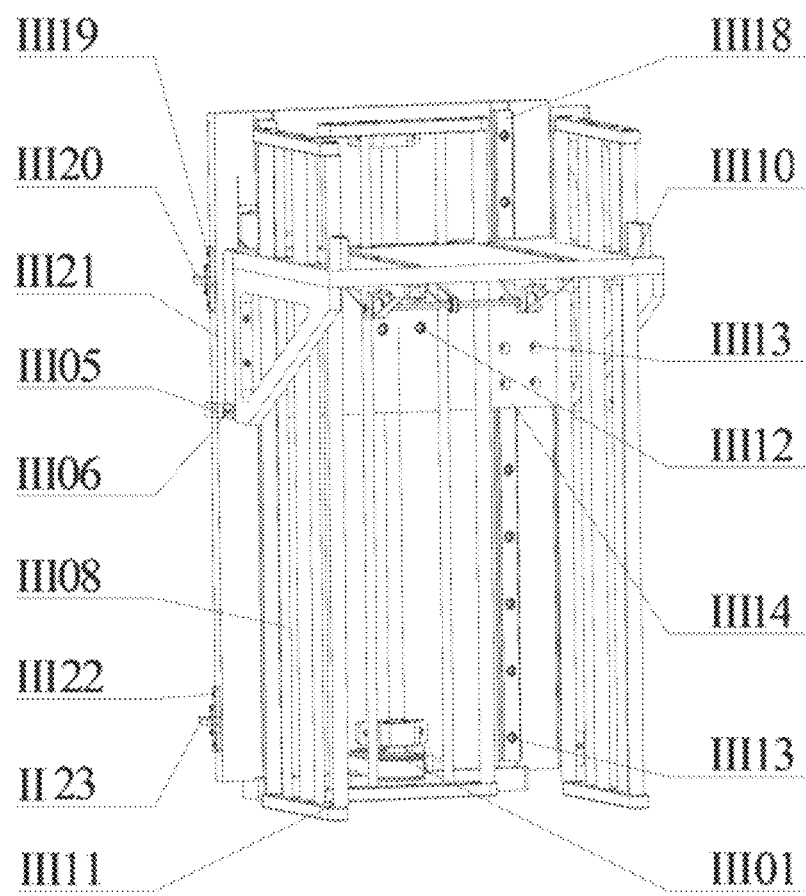
FIG. 4 is an axonometric view of a tray lifting platform.
Figure 4A:
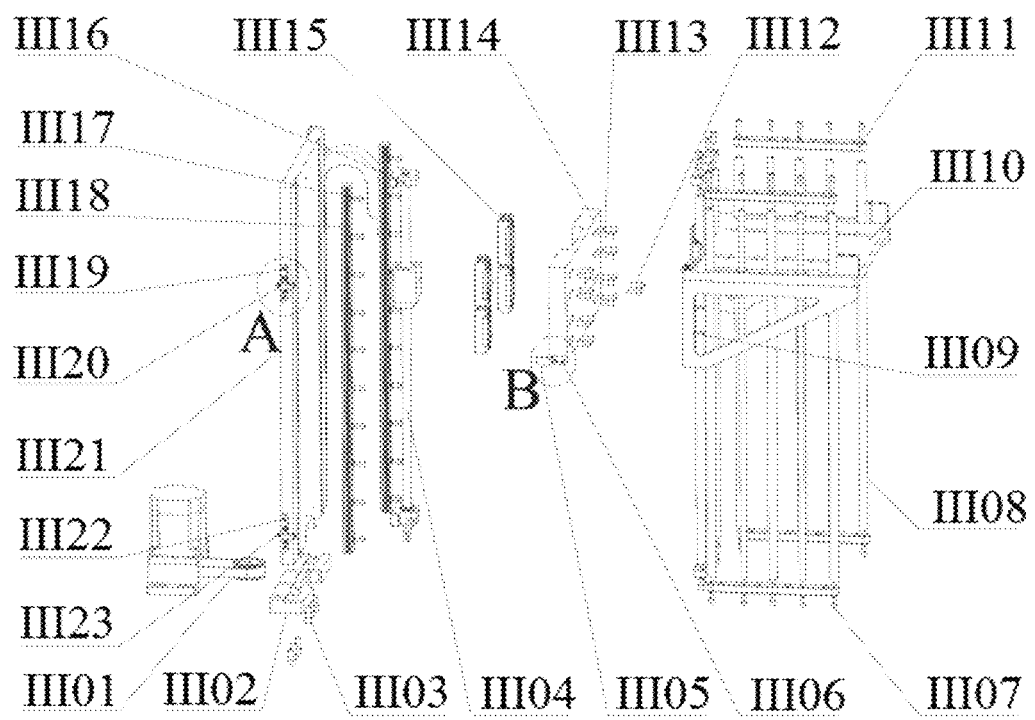
FIG. 4(a) is an exploded view of the tray lifting platform.
Figure 4B:
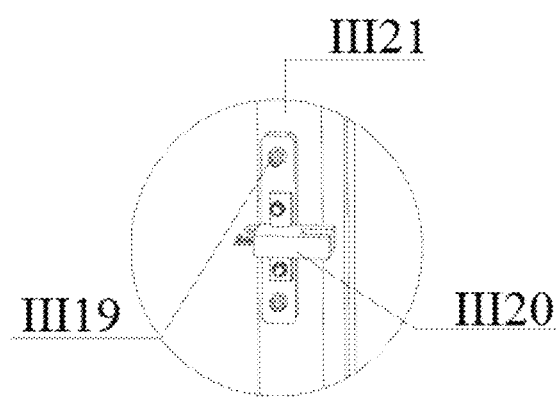
FIG. 4(b) is a partially enlarged view of a portion A in FIG. 4(a)
Figure 4C:
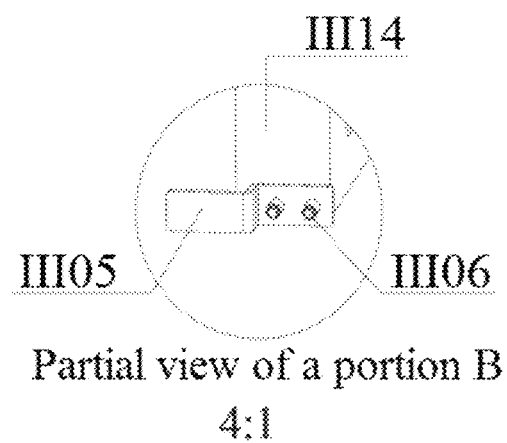
FIG. 4(c) is a partially enlarged view of a portion B in FIG. 4(a)
Figure 4D:
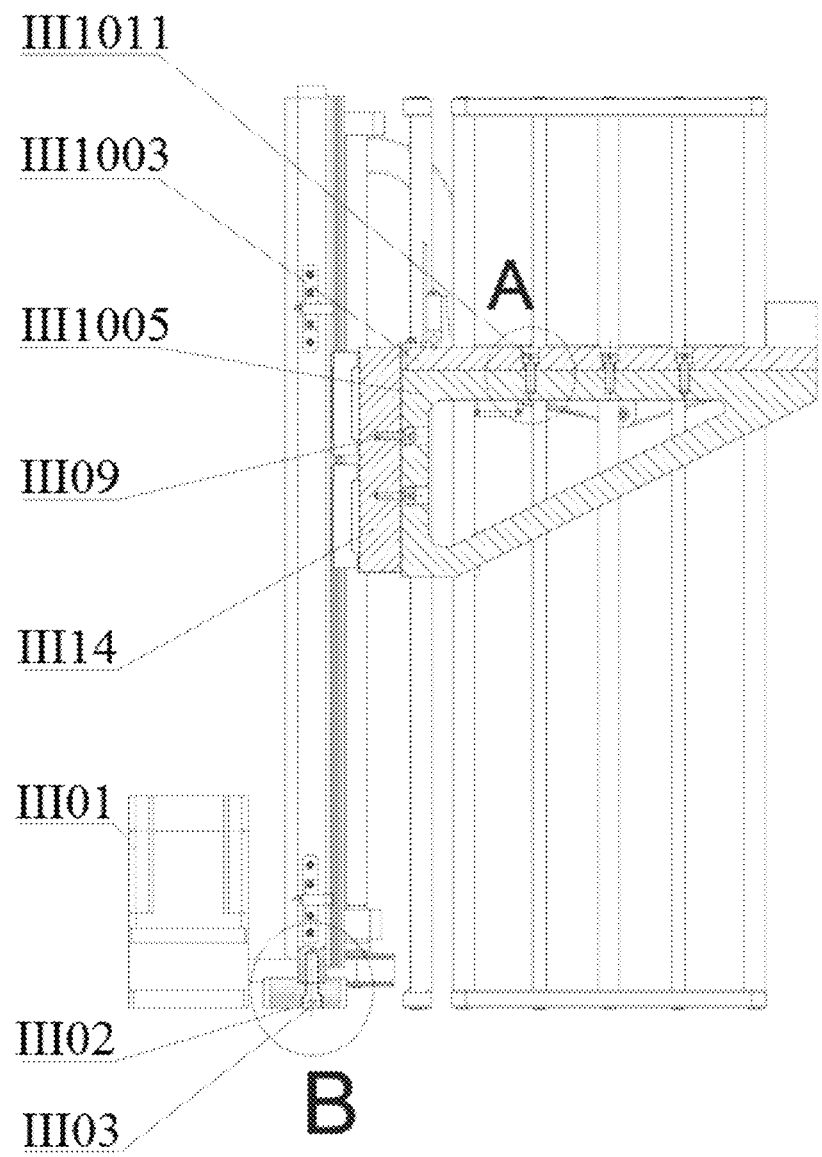
FIG. 4(d) is a partially cross-sectional view of a side view of the tray lifting platform.
Figure 4E:
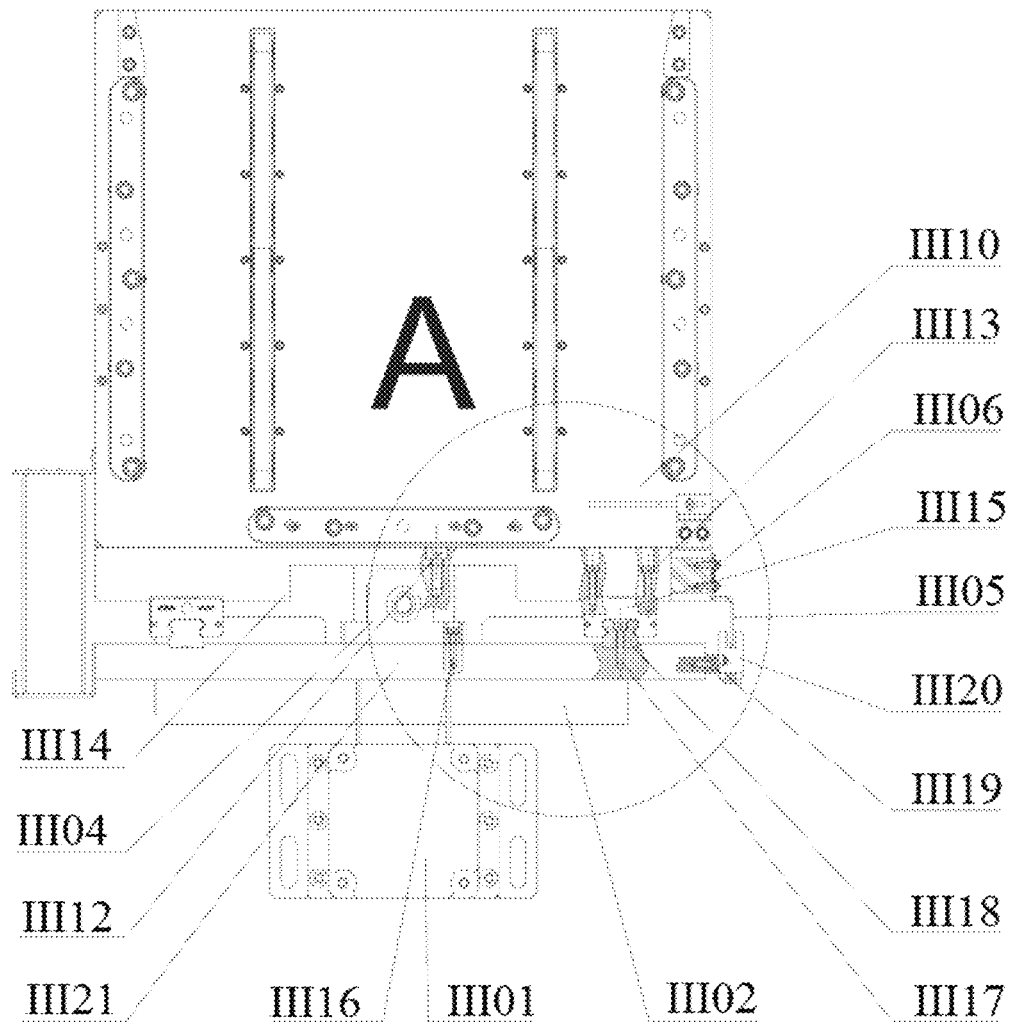
FIG. 4(e) is a partially cross-sectional top view of the tray lifting platform.
Figure 4F:
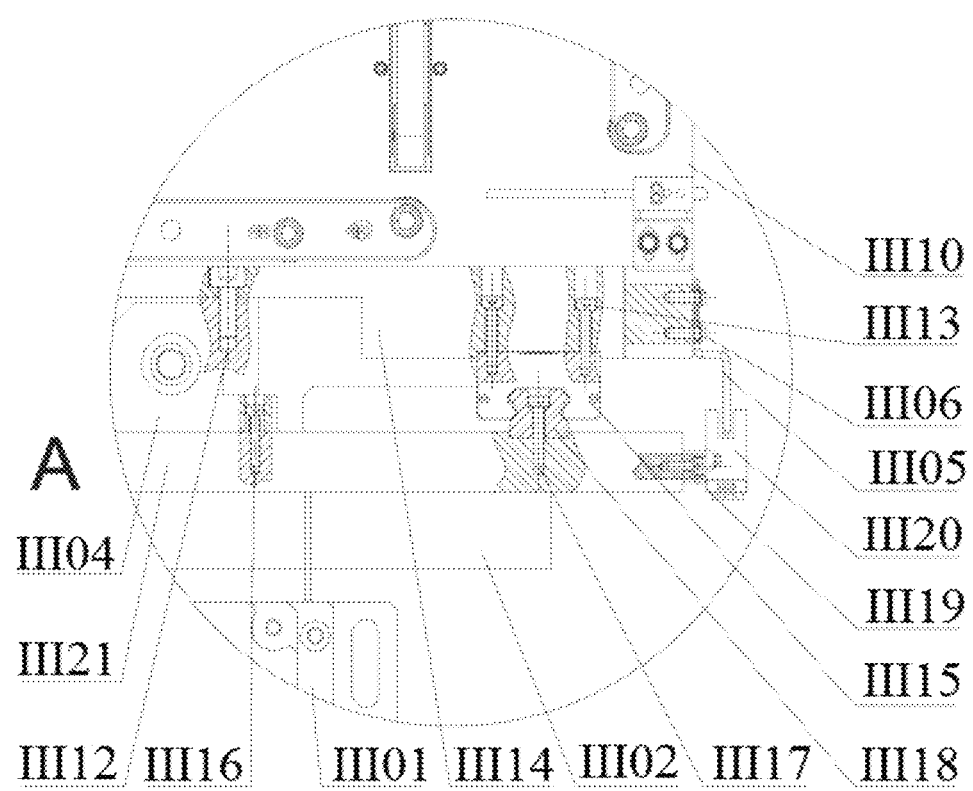
FIG. 4(f) is a partially enlarged view of a portion A in FIG. 4(e)
Figure 4G:
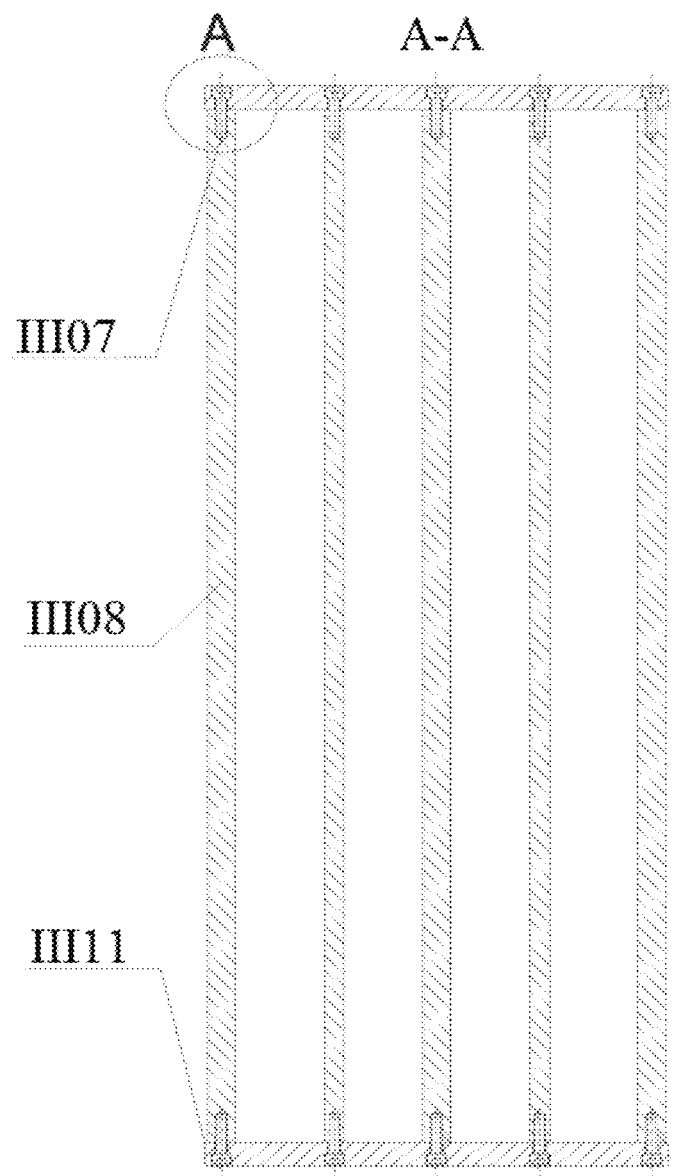
FIG. 4(g) is a cross-sectional view of A-A in FIG. 4(h)
Figure 4H:
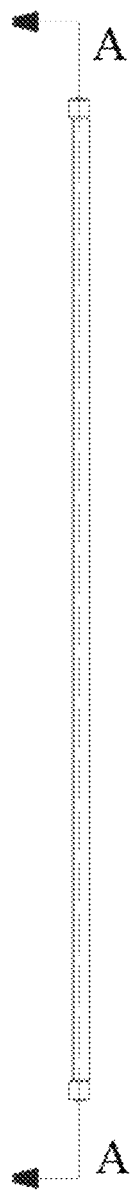
FIG. 4(h) is a side view of a supporting frame.
Figure 4I:
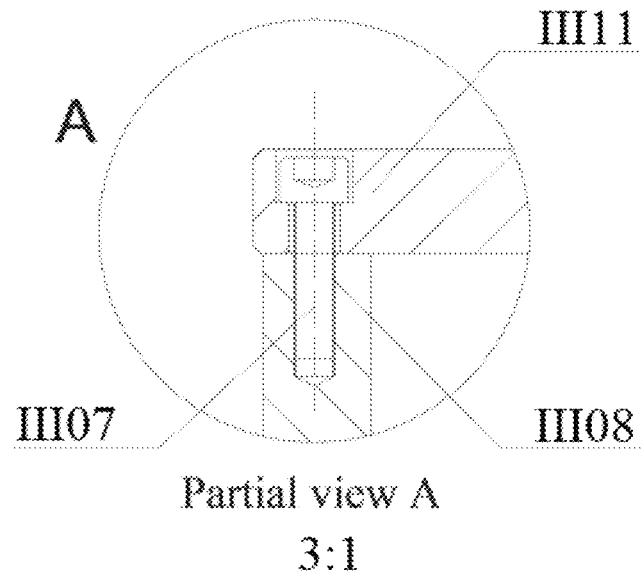
FIG. 4(i) is a partially enlarged view of a portion A in FIG. 4(h)
Figure 4J:
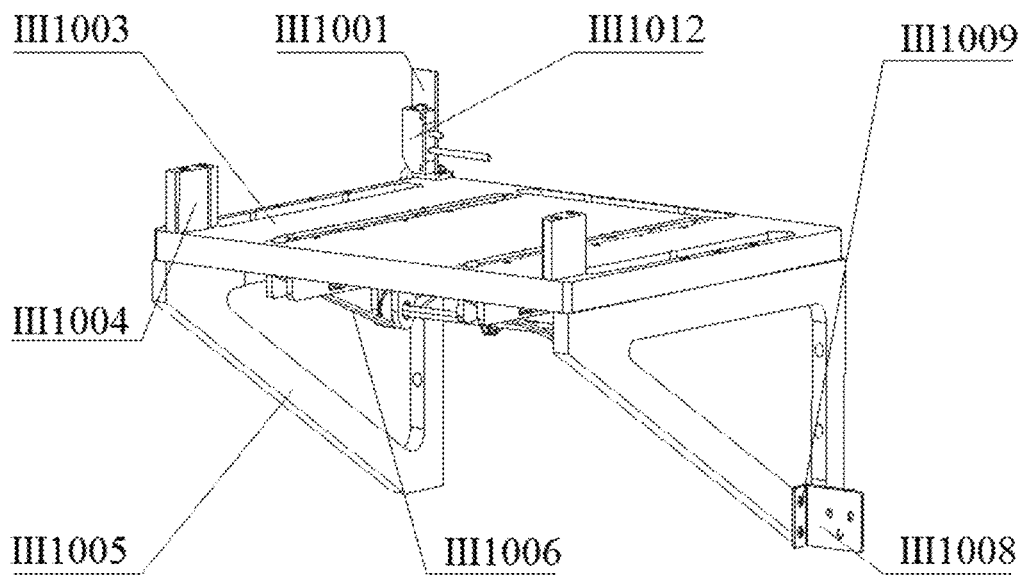
FIG. 4(j) is an axonometric side view of a first tray supporting table.
Figure 4K:
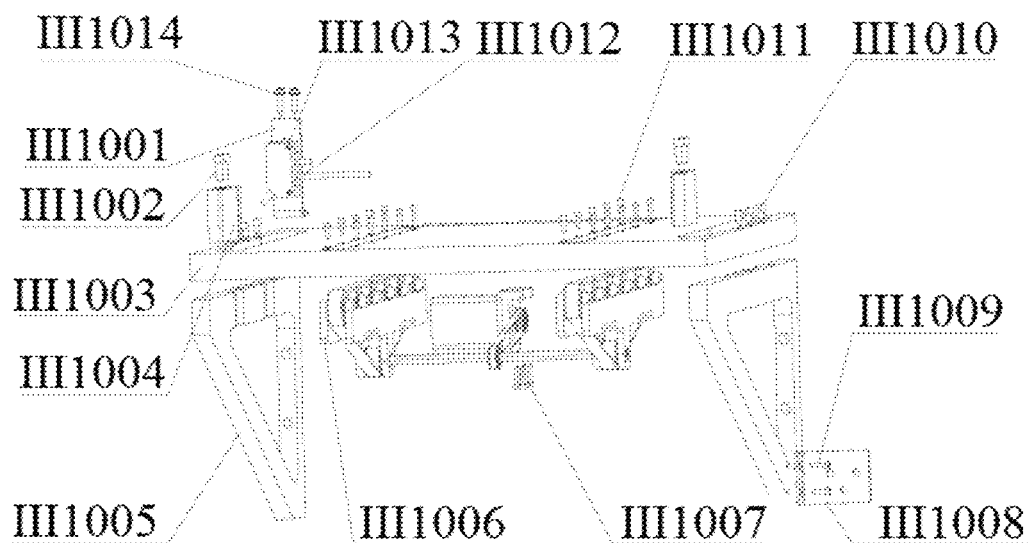
FIG. 4(k) is an exploded view of the first tray supporting table.
Figure 4L:
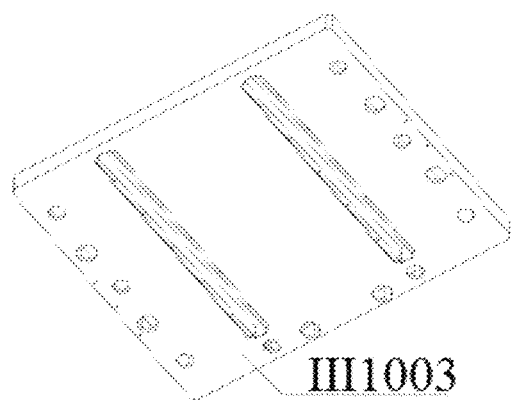
FIG. 4(l) is an axonometric side view of the first tray supporting table.
Figure 4M:
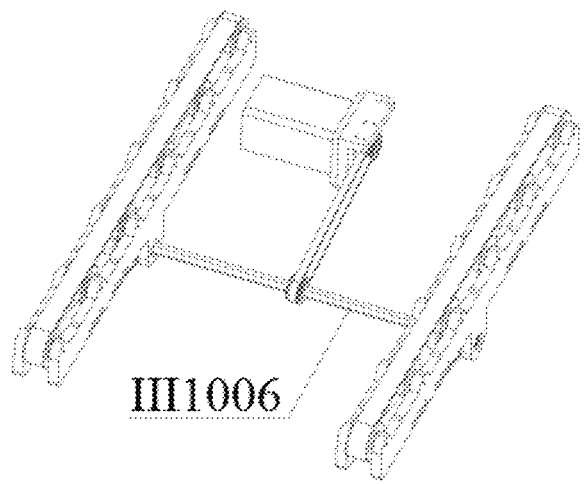
FIG. 4(m) is an axonometric view of a belt auxiliary module.
Figure 4N:
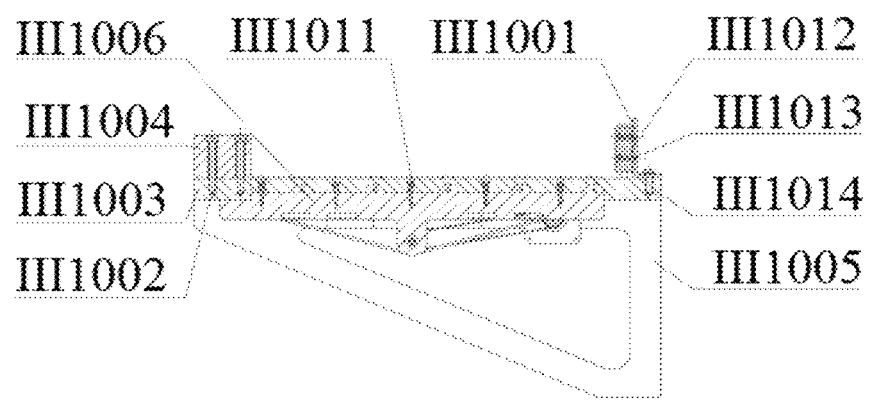
FIG. 4(n) is a top view of the first tray supporting table.

Referring to FIG. 4 to FIG. 4(i), the tray lifting platform III includes a first rear supporting plate III21. One side of the first rear supporting plate III21 is provided with multiple first supporting frames. The first supporting frame is composed of multiple first guide rods III08. Adjacent first guide rods are spaced from each other at a set distance. A first tray supporting table III10 passes through the first guide rods on both sides. The first rear supporting plate III21 supports a ball screw module II104. A lifting sliding block III15 of the ball screw module is connected with the first tray supporting table III10 through a lifting connecting plate III14. A stepping motor III01 provides power for the ball screw module; and the ball screw module drives the first tray supporting table III10 to move up and down. In an moving process of the first tray supporting table III10, the first guide rods III08 can play a role of locating and straightening. The tray lifting platform III can lift the stacked tray assemblies I with different stacked trays at a time according to production requirements.

A lower fixing plate III02 is connected to the first rear supporting plate III21 by hexagon socket head screws III03. A U-shaped photoelectric sensor III20 is fixed on a side of the first rear supporting plate III21 by hexagon flange tapping screws III19. A U-shaped photoelectric sensor III23 is fixed on the side of the first rear supporting plate III21 by hexagon flange tapping screws III22. The U-shaped photoelectric sensor III20 and the U-shaped photoelectric sensor III23 are arranged at a top and a bottom for restraining the highest and lowest positions of the first tray supporting table III10 to control the tray lifting platform III to realize feeding.

The lifting guide rail III18 is fixed on the first rear supporting plate III21 by hexagon socket head screws III17. The ball screw module II104 is connected to the first rear supporting plate III21 by hexagon socket head screws III16. Hexagon socket head screws III13 pass through a lifting connecting plate III14 and are screwed to the lifting sliding block III15. The lifting connecting plate III14 and the ball screw module II104 are connected by hexagon socket head screws III12. A first trigger sheet III05 is fixed on a side of the lifting connecting plate III14 by hexagon flange tapping screws III06. one end of the first trigger sheet III05 is set beyond the side of the lifting connecting plate III14 to trigger the U-shaped photoelectric sensor III20 or the U-shaped photoelectric sensor III23 in an up-and-down motion process of the lifting connecting plate. A hexagon socket head screw III07 passes through a retainer III11 and are screwed with the first guide rod III08. The first tray supporting platform III10 and the lifting connecting plate III14 are connected by hexagon socket head screws III09.

It is easy to understand that other forms of screws can also be selected, and are not limited to the specific screw types used in the present embodiment. The U-shaped photoelectric sensor III20 and the U-shaped photoelectric sensor III23 are also separately connected to the computer. The two U-shaped photoelectric sensors can feed back a position signal of the first tray supporting table to the computer in time, and the computer analyzes the signal and controls the tray lifting platform III to realize feeding.

Referring to FIG. 4(j) to FIG. 4(o), the first tray supporting table III10 includes a first tray supporting plate III1003. The first tray supporting plate III1003 is provided with a first elongated hole. A belt auxiliary module III1006 is arranged at a position of the first elongated hole and is arranged below the first tray supporting plate III1003. An upper surface of the belt auxiliary module III1006 is higher than an upper surface of the first tray supporting plate III1003. When the stacked tray assembly I is input from the belt input module II02 to the first tray supporting plate III1003, the belt auxiliary module III1006 may further provide power for inputting of the stacked tray assembly I, and contact and friction between the stacked tray assembly I and the first tray supporting table III10 can be reduced. Original sliding friction is converted into rolling friction, which greatly reduces a friction force on the stacked tray assembly I in an inputting process, reduces wear of the tray and prolongs service life of the tray.

Specifically, the belt auxiliary module III1006 is fixed on the first tray supporting plate III1003 by hexagon socket head screws III1011 and hexagon socket head screws III1007.

Transitional straightening blocks III1004 are mounted at an inlet of the first tray supporting plate III1003, which can play a role of straightening and locating. The transitional straightening blocks III1004 are fixed to the first tray supporting plate III1003 by hexagon socket head screws III1002. Two lateral triangular supporting plates III1005 are connected with the first tray supporting plate III1003 through hexagonal cylindrical screws III1010. A drag chain connecting sheet III1008 is fixed on one side of each lateral triangular supporting plate III1005 by hexagon socket screws III1009.

A diffuse reflection sensor III1012 is configured to detect whether the stacked tray assembly I is input in place. The diffuse reflection sensor III1012 is fixed on a sensor retainer III1001 by hexagon socket screws III1013. The sensor retainer III1001 is fixed on the first tray supporting plate III1003 by hexagon flange tapping screws III1014.

Figure 5:
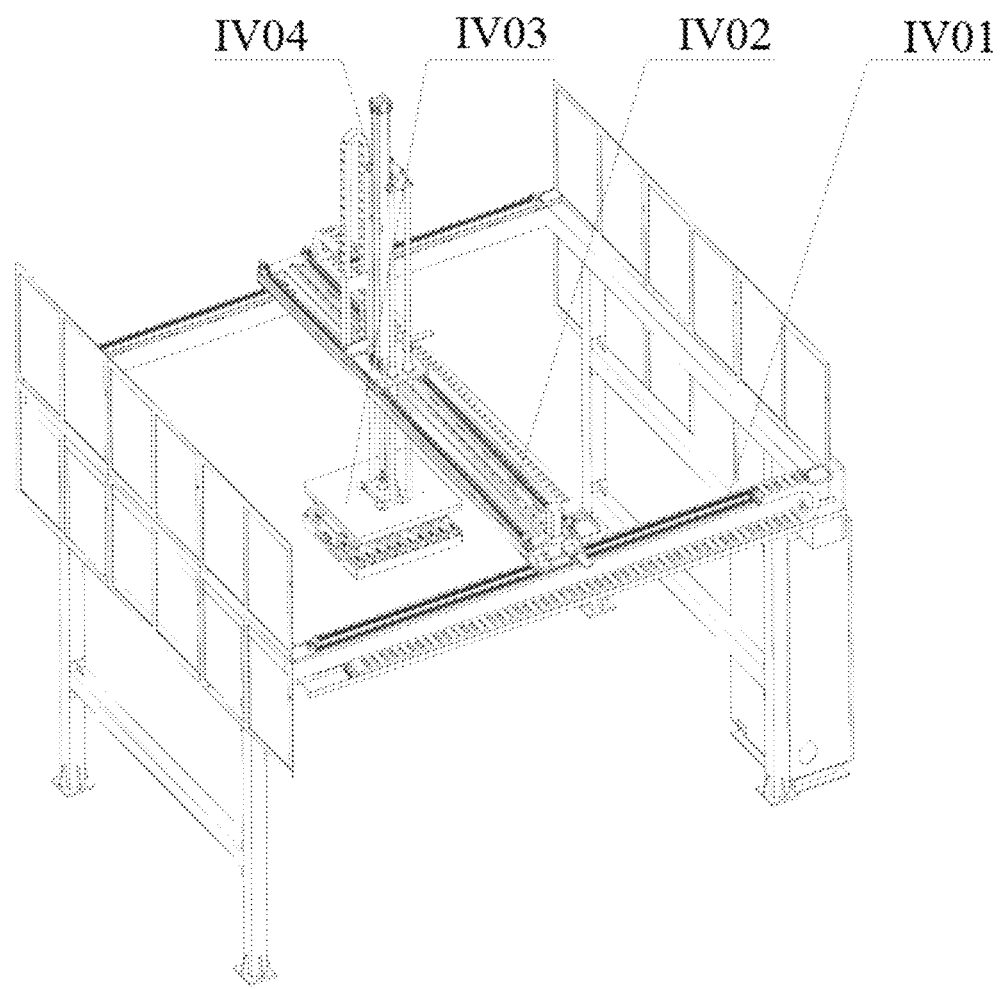
FIG. 5 is an axonometric view of a tray pick and place platform.
Figure 5A:
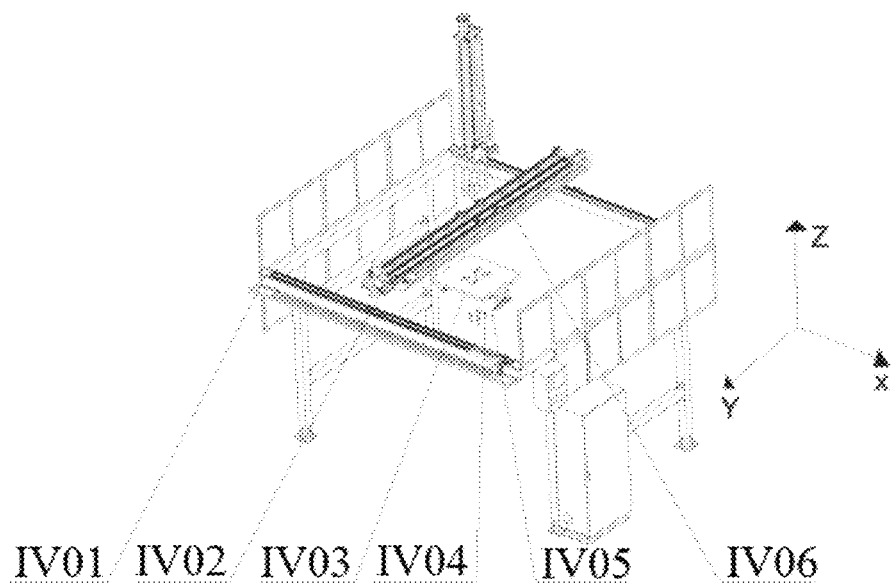
FIG. 5(a) is an exploded view of the tray pick and place platform.
Figure 5B:
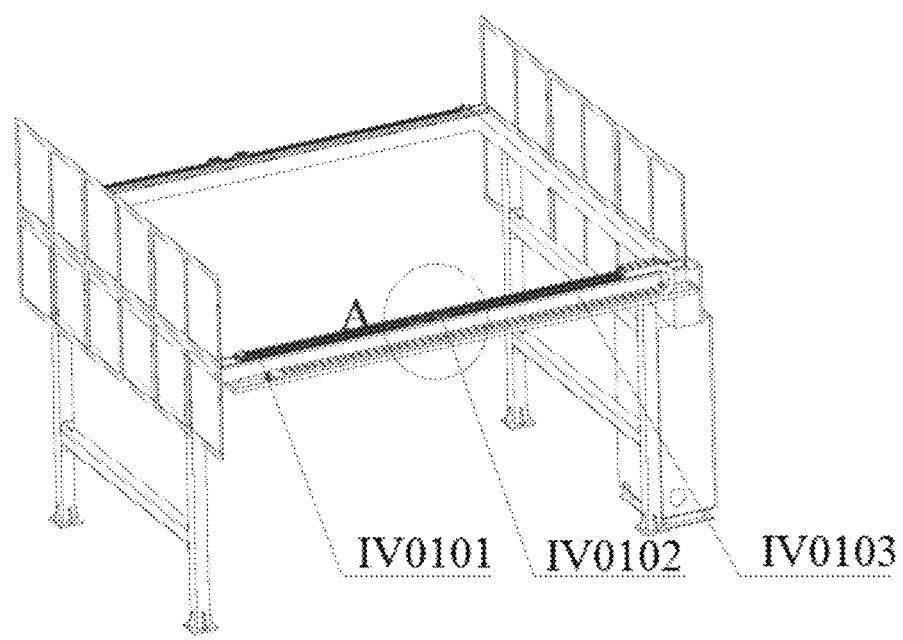
FIG. 5(b) is an axonometric view of a retainer.
Figure 5C:
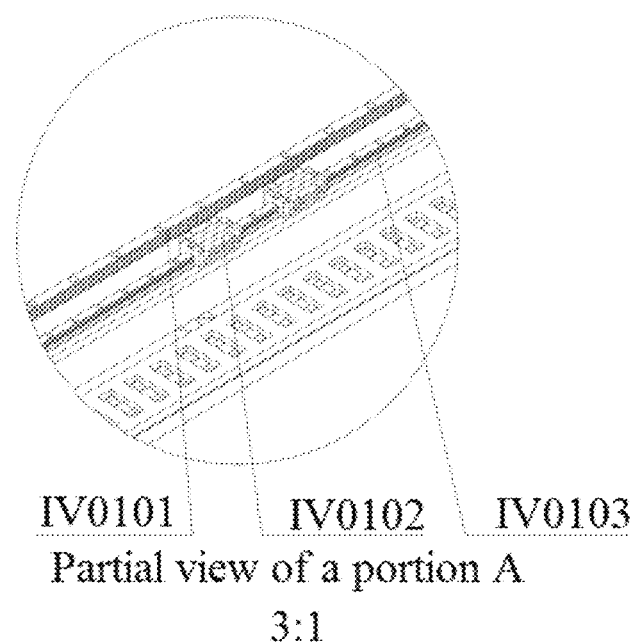
FIG. 5(c) is a partially enlarged view of a portion A in FIG. 5(b)
Figure 5D:
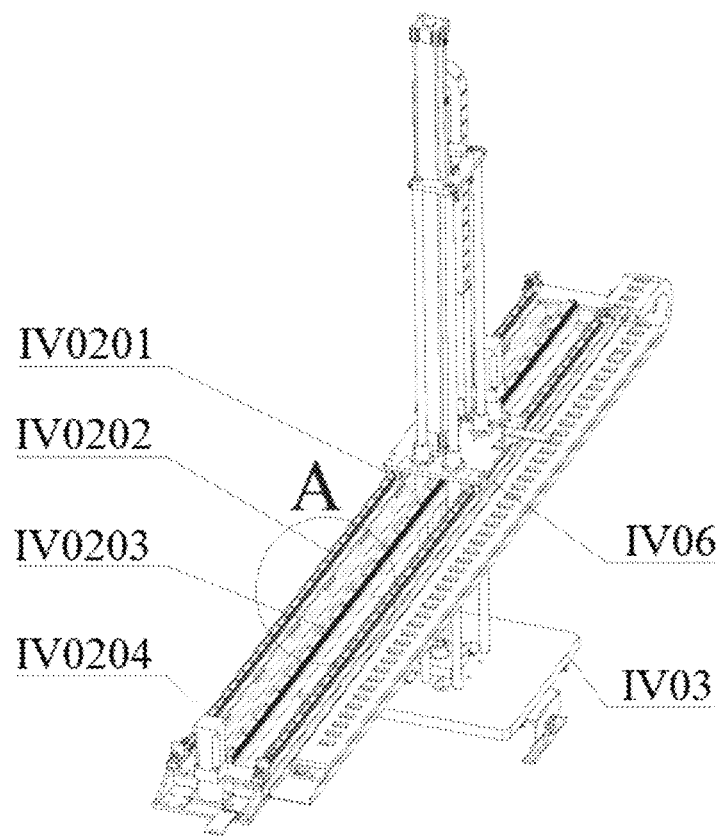
FIG. 5(d) is an axonometric view of a Y-axis directional displacement module and a Z-axis directional displacement module.
Figure 5E:
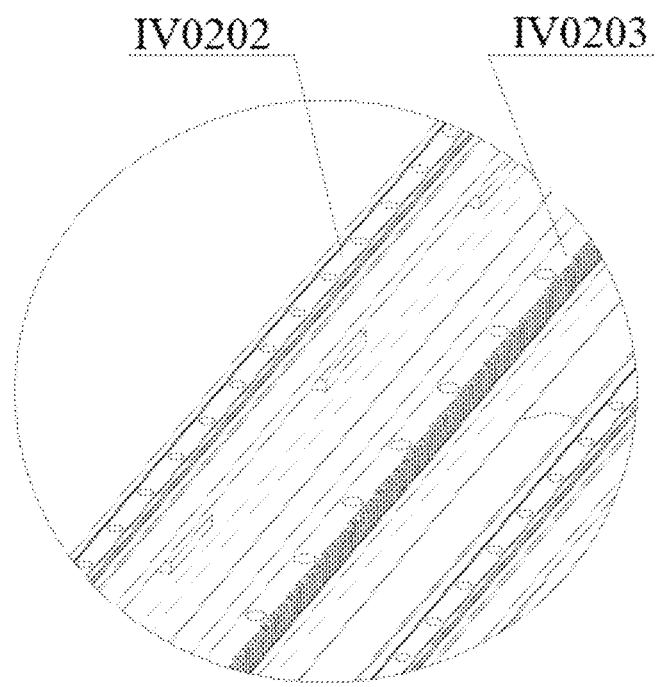
FIG. 5(e) is a partially enlarged view of a portion A in FIG. 5(d)
Figure 5F:
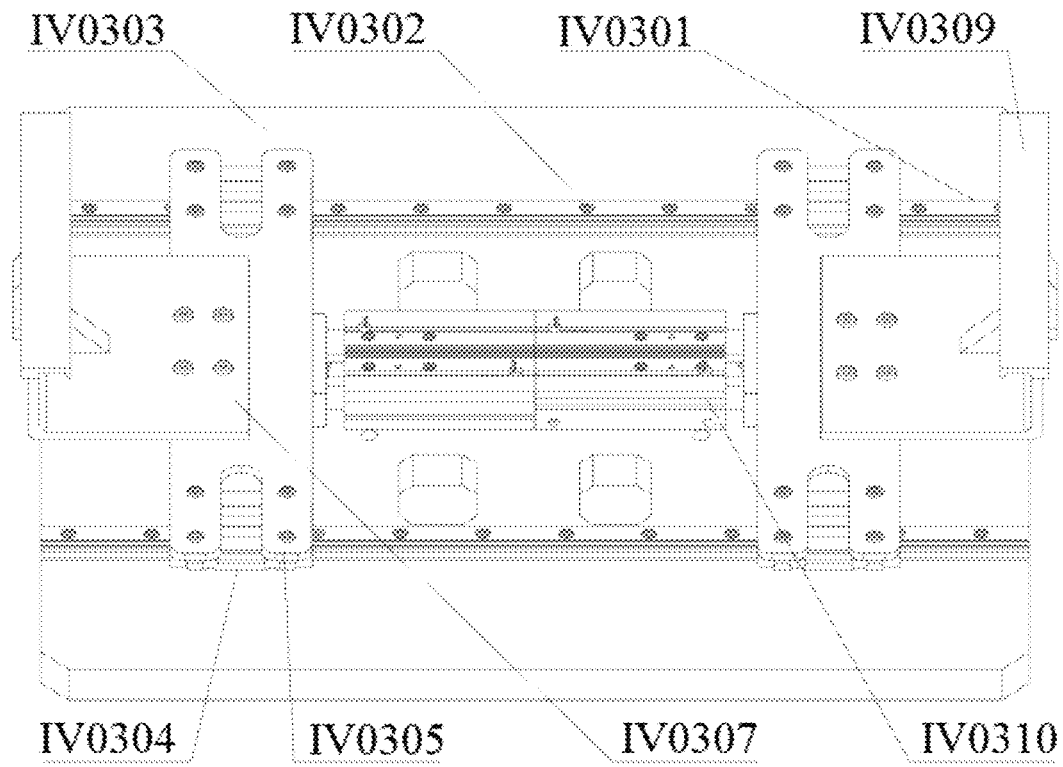
FIG. 5(f) is an axonometric view of a manipulator.
Figure 5G:
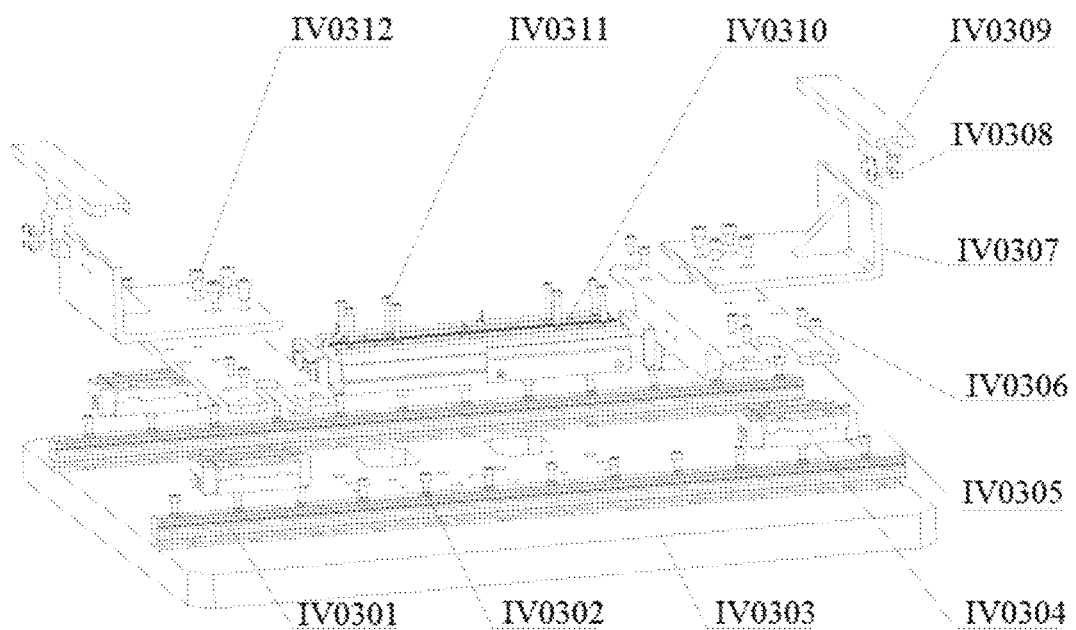
FIG. 5(g) is an exploded view of the manipulator.
Figure 5H:
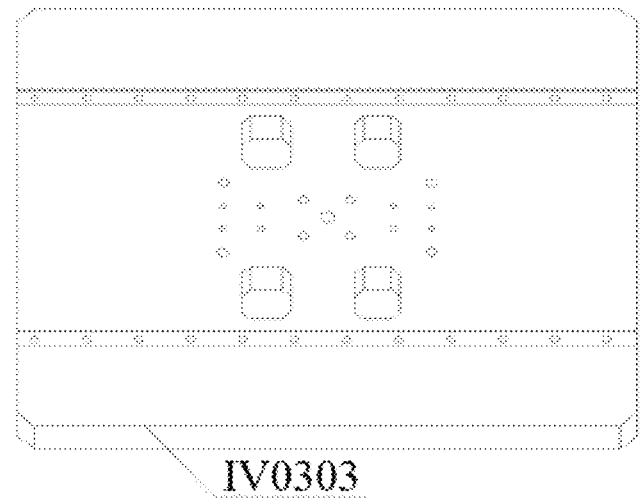
FIG. 5(h) is an axonometric view of a mounting plate.
Figure 5I:
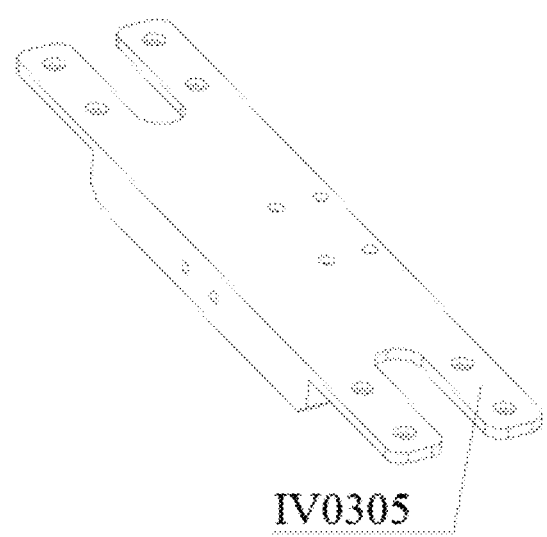
FIG. 5(i) is an axonometric view of a first L-shaped connecting plate.
Figure 5J:
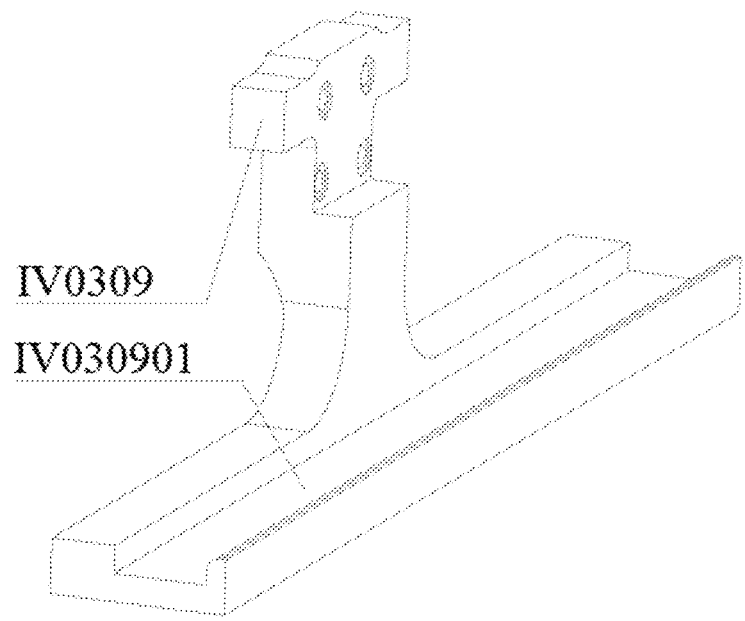
FIG. 5(j) is an axonometric view of a grooved hook.

Referring to FIG. 5 to FIG. 5(e), the tray pick and place platform IV includes a tray grabbing manipulator IV03, a retainer IV01, a Y-axis directional displacement module IV02 and Z-axis directional displacement module IV06. The retainer IV01 has a set height. X-axis directional displacement modules are arranged on both sides of the retainer IV01. Each X-axis directional displacement module includes a first rack IV0101, the first sliding block IV0102 and a first linear guide rail IV0103. The first sliding block IV0102 is arranged on the first linear guide rail IV0103. The first sliding block IV0102 and the Y-axis directional displacement module IV02 are connected by screws. The first rack IV0101 is arranged on one side of the first linear guide rail IV0103, is disposed in a manner of being slightly higher than the first linear guide rail IV0103, and is fixed on the retainer. A second gear motor IV0204 meshes with the first rack IV0101 to drive the Y-axis directional displacement module IV02 to move along the first linear guide rail IV0103. And the Y-axis directional displacement module IV02 is supported by the retainer IV01.

Similarly, the Y-axis directional displacement module IV02 includes a Y-direction supporting frame. The Y-direction supporting frame is provided with a second sliding block IV0201, a second linear guide rail IV0202, a second rack IV0203 and a second gear motor IV0204. The second gear motor IV0204 is arranged at a side part of the Y-direction supporting frame, and the second sliding block IV0201 is arranged on the second linear guide rail IV0202. The Z-axis directional displacement module IV06 and the second sliding block IV0201 are connected by screws. The second rack IV0203 is fixed on the Y-direction supporting frame by screws. The third gear motor IV0604 mounted on the Z-axis directional displacement module IV06 meshes with the second rack IV0203 to drive the Z-axis directional displacement module IV06 to move along a direction of the second linear guide rail IV0202. The Y-axis directional displacement module IV02 is configured to support the Z-axis directional displacement module IV06. The manipulator IV03 and the Z-axis directional displacement module IV06 are connected by the hexagon socket head screws IV04 and IV05, and the manipulator IV03 is disposed below the retainer.

Figure 5K:
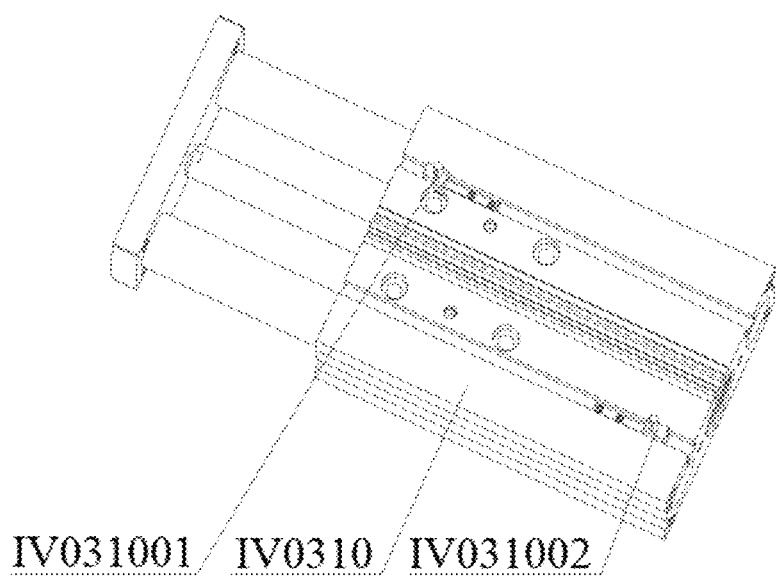
FIG. 5(k) is an axonometric view of the double guide rod cylinder.
Figure 5L:
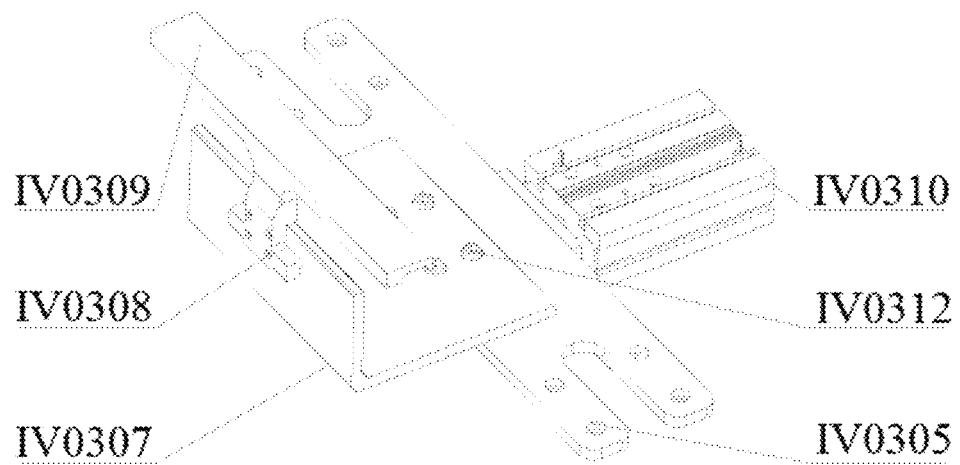
FIG. 5(l) is an axonometric view of a core module of the manipulator.
Figure 5M:
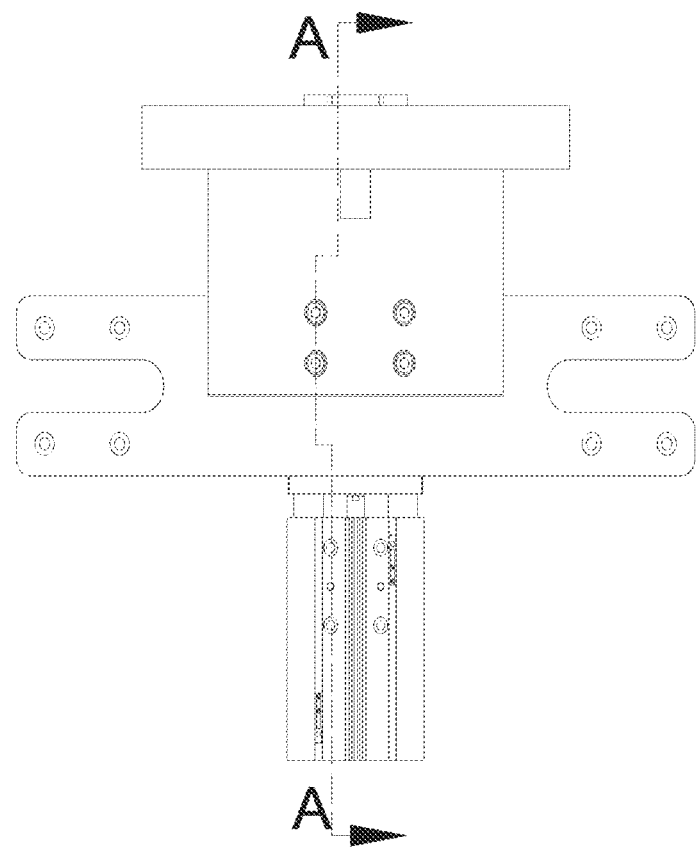
FIG. 5(m) is a top view of the core module of the manipulator.
Figure 5N:
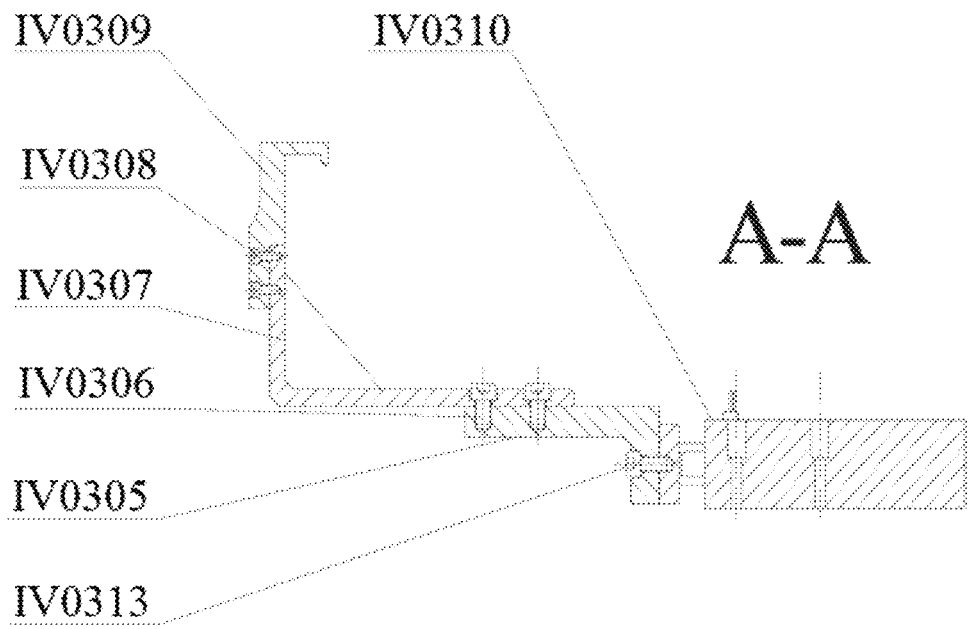
FIG. 5(n) is a cross-sectional view of the core module of the manipulator taken along the section A-A in FIG. 5(m)

Referring to FIG. 5(f) to FIG. 5(i), the manipulator IV03 includes a mounting plate IV0303. The mounting plate IV0303 is arranged below the Y-axis directional displacement module IV02. The inner side of the mounting plate IV0303 facing the Y-axis directional displacement module IV02 is provided with a third linear sliding rail IV0301. The third linear sliding rail IV0301 is fixed on the mounting plate IV0303 by hexagon socket head screws IV0302. A double guide rod cylinder IV0310 is fixed on the mounting plate IV0303 by hexagon socket head screws IV0311. Referring to FIG. 5(k), the double guide rod cylinder IV0310 is embedded with a magnetic proximity sensor IV031001 and a magnetic proximity sensor IV031002.

One end of the first L-shaped connecting plate IV0305 is connected with the third sliding block IV0304 by hexagon socket head screws IV0306, and the other end of the first L-shaped connecting plate IV0305 is connected with the double guide rod cylinder IV0310 by hexagon socket head screws IV0313. One end of the second L-shaped connecting plate IV0307 is connected with the first L-shaped connecting plate IV0305 by hexagon socket head screws IV0312, and the other end of the second L-shaped connecting plate IV0307 is connected with a grooved hook IV0309 by hexagon socket head screws IV0308.

Referring to FIG. 5(j), FIG. 5(l) to FIG. 5(o), a positioning groove IV030901 is machined along a length direction of the grooved hook IV0309. The positioning groove is arranged so that it can cooperate with the grab groove I0105 on both sides of the tray I to increase stability and reliability of the grabbing and transporting of the tray.

Referring to FIG. 5(p) to FIG. 5(t), the Z-axis directional displacement module IV06 is installed in a manner of passing through the Y-axis directional displacement module IV02, and includes a cylinder mounting plate IV0602 and multiple guide rods IV0607 passing through the cylinder mounting plate IV0602. An top end of each of the multiple guide rods IV0607 is provided with a guide rod retainer IV0610. A cylinder IV0608 is fixed on the cylinder mounting plate IV0602. The third gear motor IV0604 is fixed on the cylinder mounting plate IV0602 by screws VI0603. A cylinder piston rod IV0608 passes through the cylinder mounting plate IV0602 and is connected to a connecting block IV0601. The connecting block IV0601 is connected to the mounting plate IV0303 of the manipulator IV03 by hexagon socket head screw IV04. Multiple magnetic proximity sensors IV0605, IV0606, IV0609 and IV0611 are embedded on the cylinder IV0608. and the multiple magnetic proximity sensors on the cylinder IV0608 are arranged along a shell of the cylinder to control the stroke of a piston of the cylinder IV0608. The guide rod IV0607 passes through the cylinder mounting plate IV0602 and is connected to the mounting plate of the manipulator IV03 by hexagon socket head screws IV05.

It is easy to understand that the above-mentioned rack is a precision rack, and the length of the rack is consistent with the length of the retainer.

In the manipulator IV03, the grooved hook IV0309 is driven by the double guide rod cylinder IV0310 to move transversely to realize opening and closing of the manipulator IV03. In this process, corresponding sliding blocks and linear guide rails in the manipulator IV03 cooperate with each other to play roles of supporting and guiding. The magnetic proximity sensor IV031001 and the magnetic proximity sensor IV031002 are embedded to a cylinder body of the double guide rod cylinder IV0310, which can feed back opened and closed states of the manipulator IV03 to the computer in time.

The second gear motor IV0204 of the Y-axis directional displacement module IV02 and the first rack IV0101 of the X-axis directional displacement module cooperate with each other to drive the manipulator IV03 to move in an X-axis direction. In this process, the first sliding block IV0102 and the first linear guide rail IV0103 of the X-axis directional displacement module cooperate with each other to play roles of supporting and guiding. The third gear motor IV0604 of the Z-axis directional displacement module IV06 and the second rack IV0203 of the Y-axis directional displacement module IV02 cooperate with each other to drive the manipulator IV03 to move in a Y-axis direction. In this process, the second sliding block IV0201 and the second linear guide rail IV0202 of the Y-axis directional displacement module cooperate with each other to play roles of supporting and guiding. The cylinder IV0608 in the Z-axis directional displacement module IV06 can drive the manipulator IV03 to move in the Z-axis direction. And the multiple guide rods IV0607 installed around the cylinder can improve the stability and reliability of the motion of the manipulator IV03 in the Z-axis direction.

Figure 6:
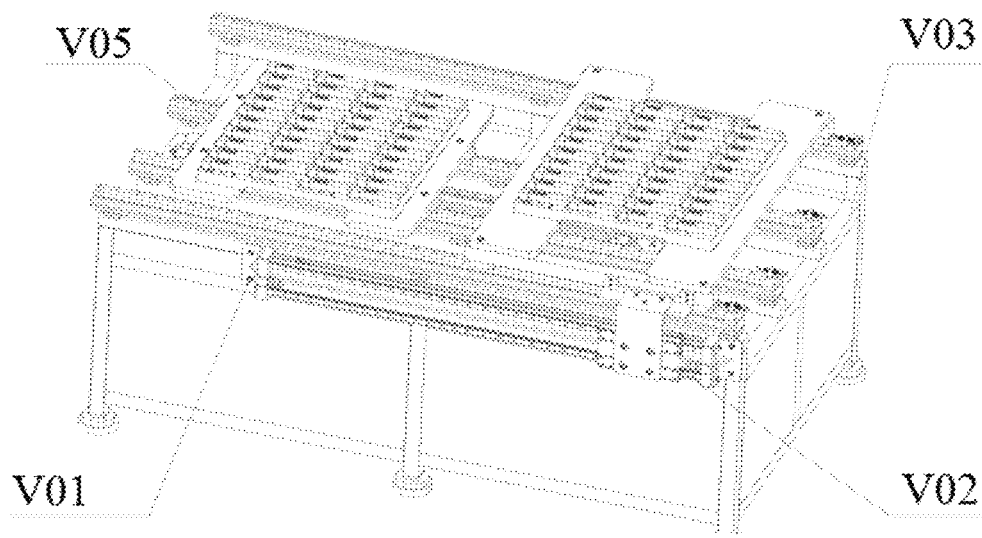
FIG. 6 is an axonometric view of a double layer delivery table.
Figure 6A:
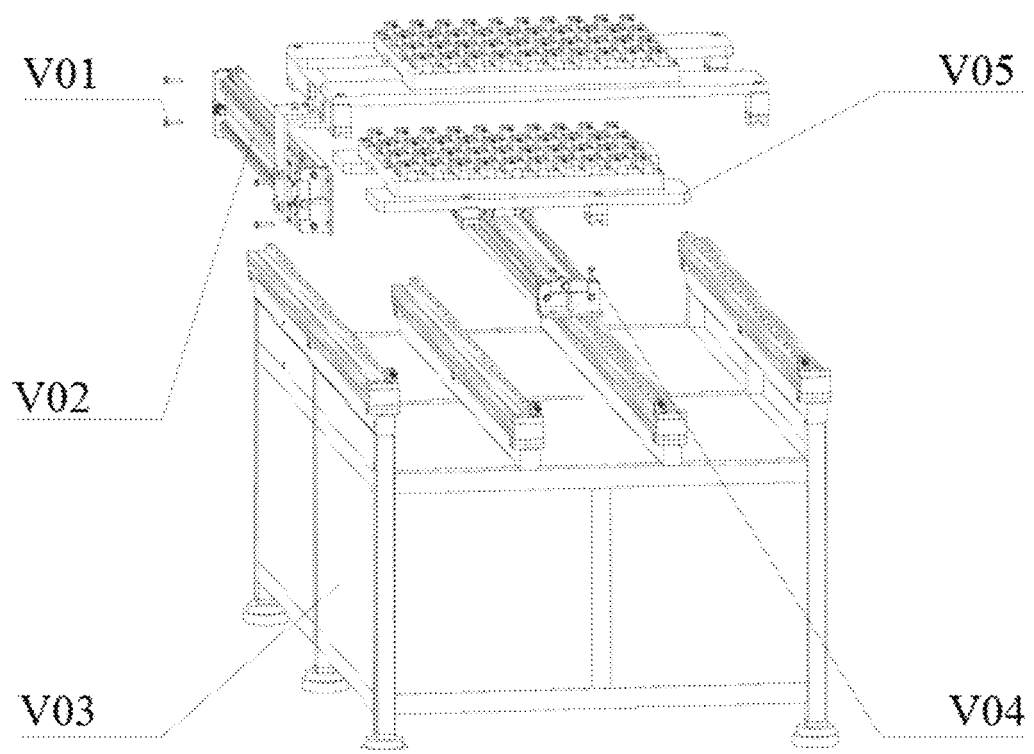
FIG. 6(a) is an exploded view of the double layer delivery table.
Figure 6B:
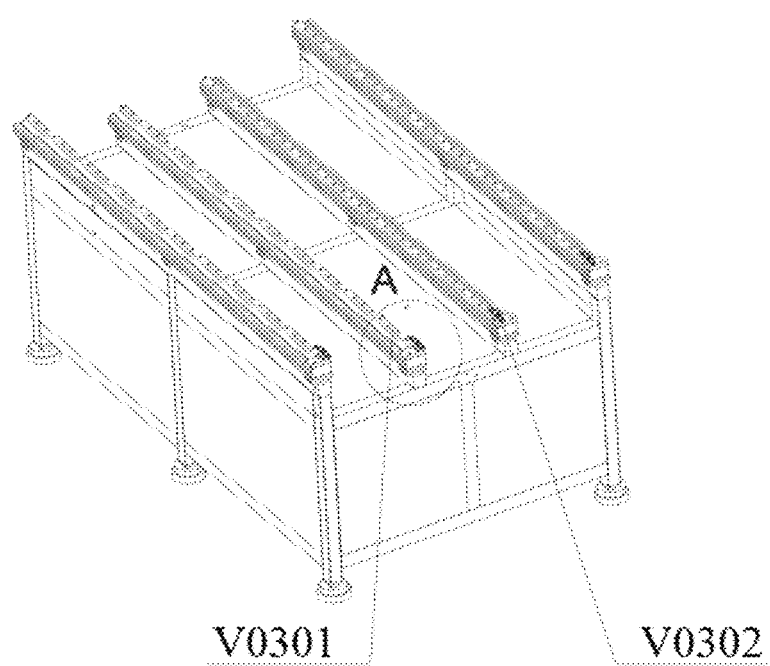
FIG. 6(b) is an axonometric view of a table main body.
Figure 6C:
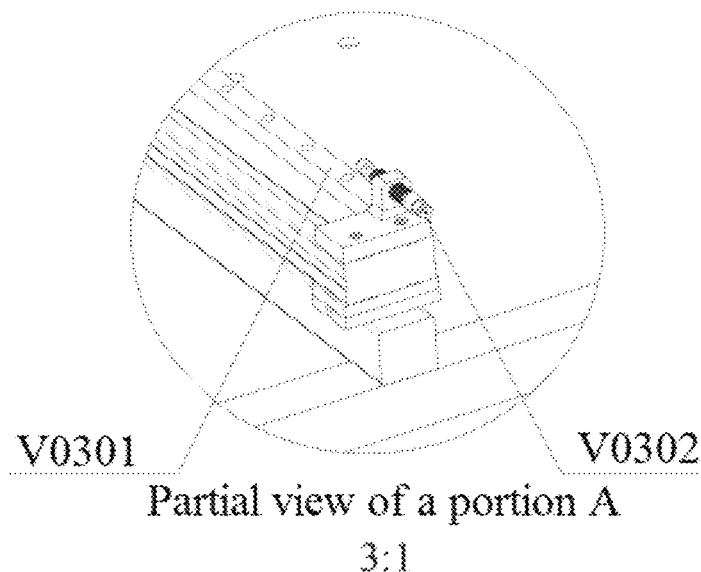
FIG. 6(c) is a partially enlarged view of a portion A in FIG. 6(b)
Figure 6D:
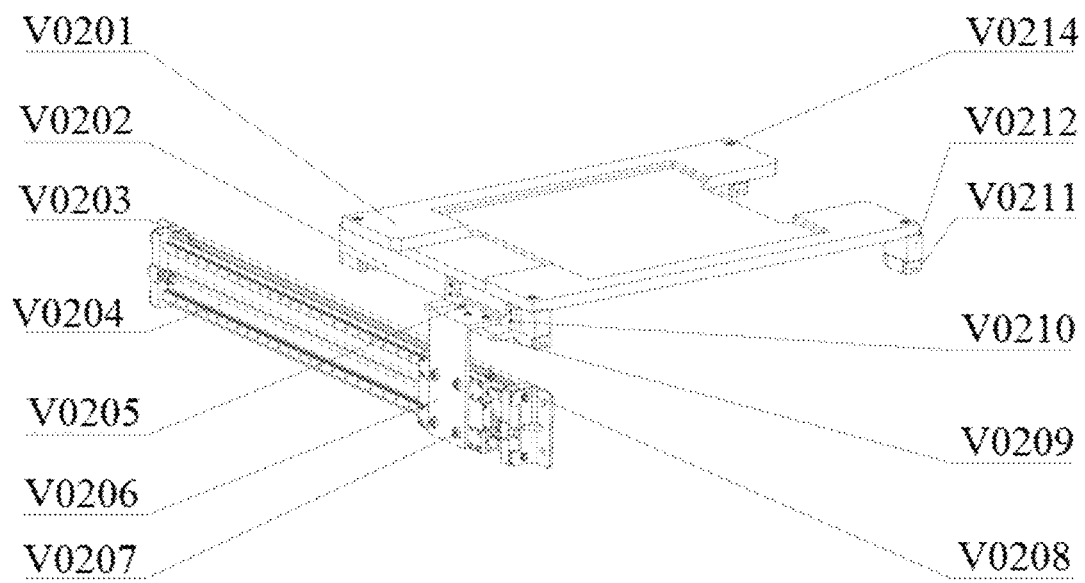
FIG. 6(d) is an axonometric view of an upper layer tray push-pull module.
Figure 6E:
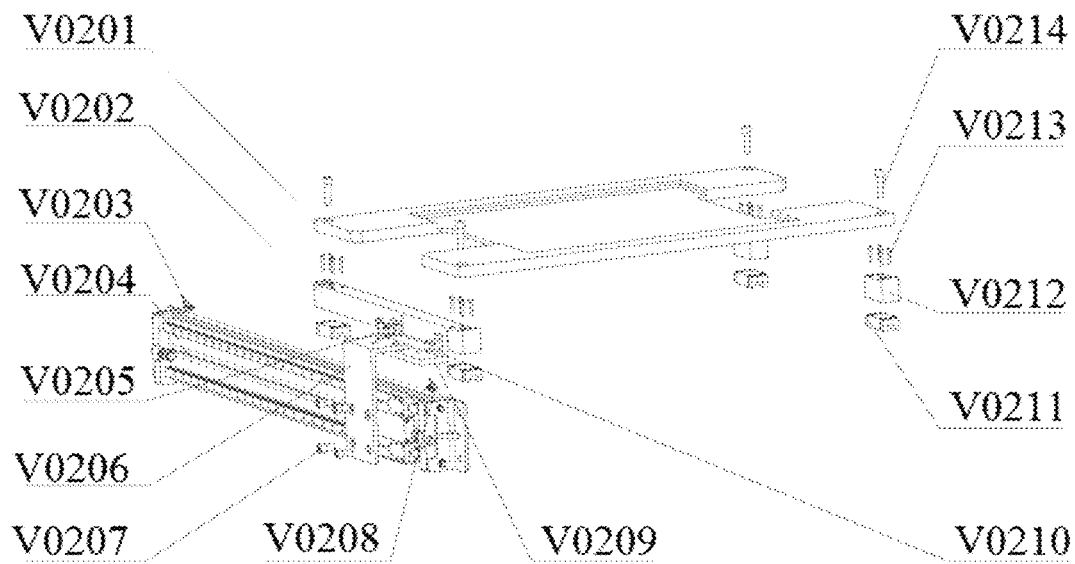
FIG. 6(e) is an exploded view of the upper layer tray push-pull module.

Referring to FIG. 6 and FIG. 6(a), the double layer delivery table V includes a table main body V03, an upper layer tray push-pull module V02 and a lower layer tray push-pull module V05. The table main body V03 supports the upper layer tray push-pull module V02 and the lower layer tray push-pull module V05. The upper layer tray push-pull module and the lower layer tray push-pull module can alternately supply materials to the robot VI behind, which greatly reduces waiting time of the robot during replacement. The upper layer tray push-pull module V02 and the table main body V03 are connected by hexagon flange tapping screws V01. And the lower layer tray push-pull module V05 is fixed on the table main body V03 by hexagon flange tapping screws V04.

Referring to FIG. 6(b) to FIG. 6(e), multiple table linear guide rails V0301 are installed on the table main body V03, and an upper layer tray placement plate V0201 and a lower layer tray placement plate V0512 are supported by the table linear guide rails. Grooves are machined on the upper layer tray placement plate V0201 and a lower layer tray placement plate V0512, and the shape of the groove is the same as that of the tray I01, which can play good roles of locating and carrying the tray. The tray can be pulled back (close to the robot VI) and pushed out (away from the robot VI) by a power mechanism to realize alternate feeding of the double layer delivery table V. Two sides of the upper layer tray placement plate V0201 are driven by first rodless cylinder sliding tables V0204 arranged on two sides of the table main body V03 to move. A lower surface of the lower layer tray placement plate V0512 is driven by a second rodless cylinder sliding table V0204 arranged on an upper surface of the table main body V03 to move along the table linear guide rail V0301. Cylinder buffers V0302 are mounted at extreme positions where the upper layer and lower layer tray placement plates are pushed out, which can absorb shock caused by sudden stop of the trays I01 being pushed to the extreme positions. Furthermore, a proximity sensor connected to the computer is embedded to a side of a cylinder body of each rodless cylinder sliding table and can transmit position information of the upper layer or lower layer trays to the computer in time.

An extended connecting block V0202 and a connecting block V0212 are respectively disposed on both sides of the upper layer tray placement plate V0201, and are fixed to a lower part of the upper layer tray placement plate V0201 by hexagon socket head screws V0214. Hexagon socket head screws V0213 pass through the connecting block V0212 and the extended connecting block V0202 and are screwed with the table sliding block V0211.

A side of the extended connecting block V0202 is connected with a fourth L-shaped connecting plate V0209, and the fourth L-shaped connecting plate V0209 is fixed on the side of the extended connecting block V0202 by hexagon socket head screws V0210. One end of a third L-shaped connecting plate V0206 is connected to the fourth L-shaped connecting plate V0209 by hexagon socket head screws V0205, and the other end of the third L-shaped connecting plate V0206 is fixed on the first rodless cylinder sliding table V0204 by hexagon socket head screws V0207. Two ends of the first rodless cylinder sliding table V0204 are respectively embedded with a magnetic proximity sensor V0203 and a magnetic proximity sensor V0208.

Figure 6F:
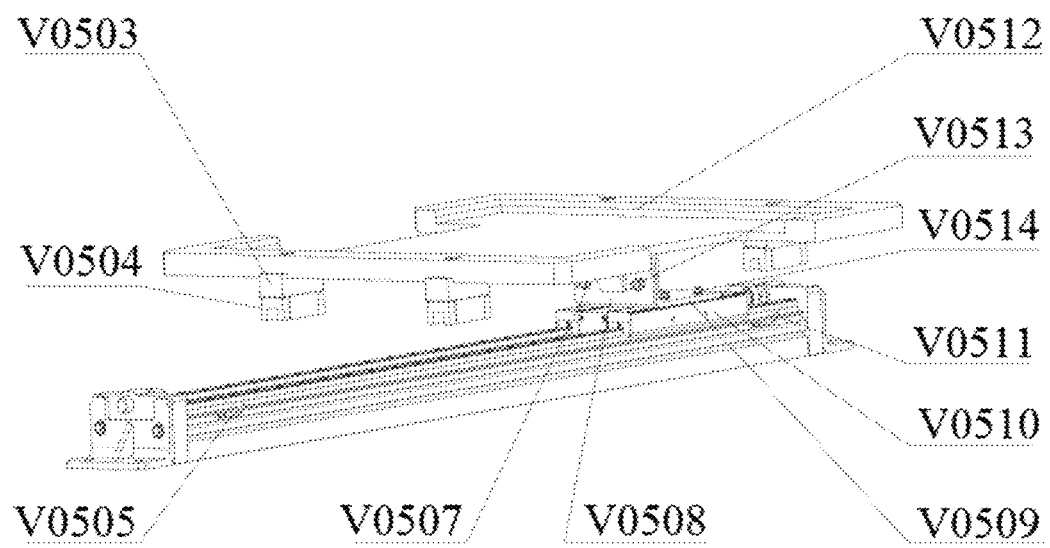
FIG. 6(f) is an axonometric view of a lower layer tray push-pull module.
Figure 6G:
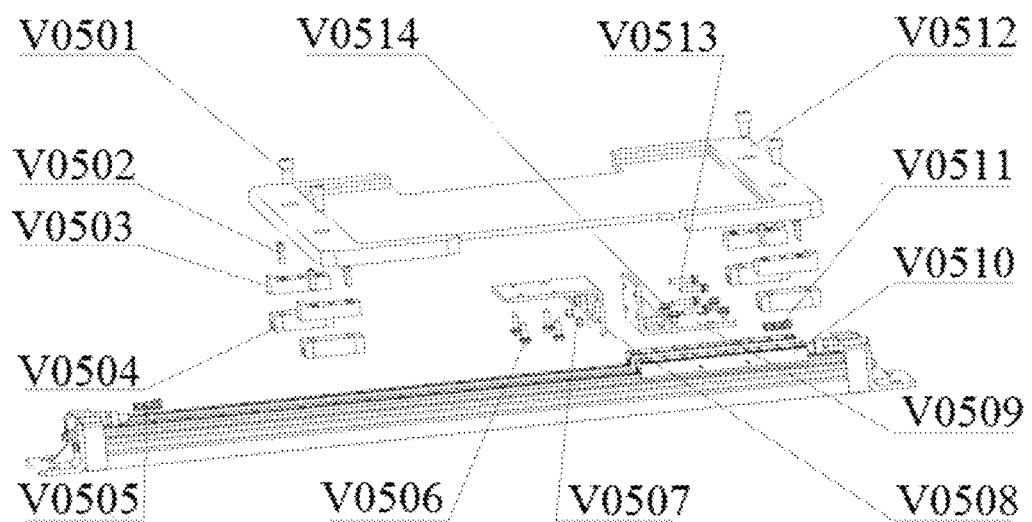
FIG. 6(g) is an exploded view of the lower layer tray push-pull module.

Referring to FIG. 6(f) and FIG. 6(g), a table connecting block V0503 is fixed to a lower part of the lower layer tray placement plate V0512 by hexagon socket head screws V0501. A sliding block V0504 and a connecting block V0503 are connected by hexagon socket head screws V0502. One end of a first connecting plate V0508 is connected with the lower layer tray placement plate V0512 by hexagon flange tapping screws V0506, and the other end of the first connecting plate V0508 is fixedly connected with a second connecting plate V0509 by screwings between hexagon flange bolts V0513 and hexagon nuts V0507. The second connecting plate V0509 is fixed on the second rodless cylinder sliding table V0510 by hexagon flange tapping screws V0514. Two ends of the second rodless cylinder sliding table V0510 are respectively embedded with a magnetic proximity sensor V0505 and a magnetic proximity sensor V0511.

Figure 8:
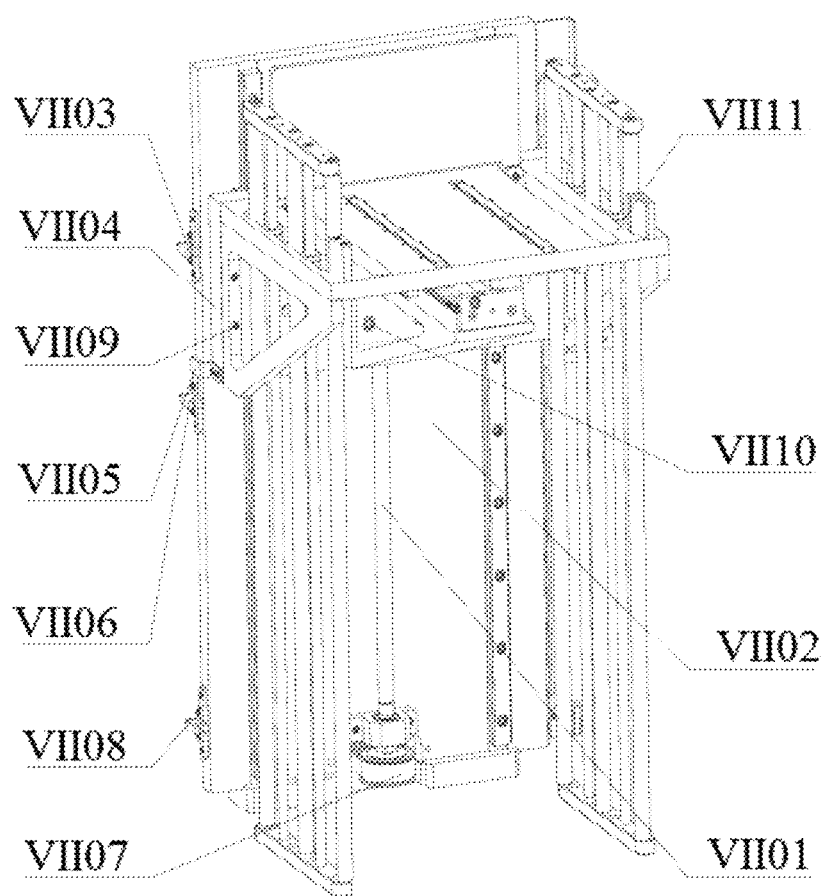
FIG. 8 is an axonometric view of a tray lowering platform.
Figure 8A:
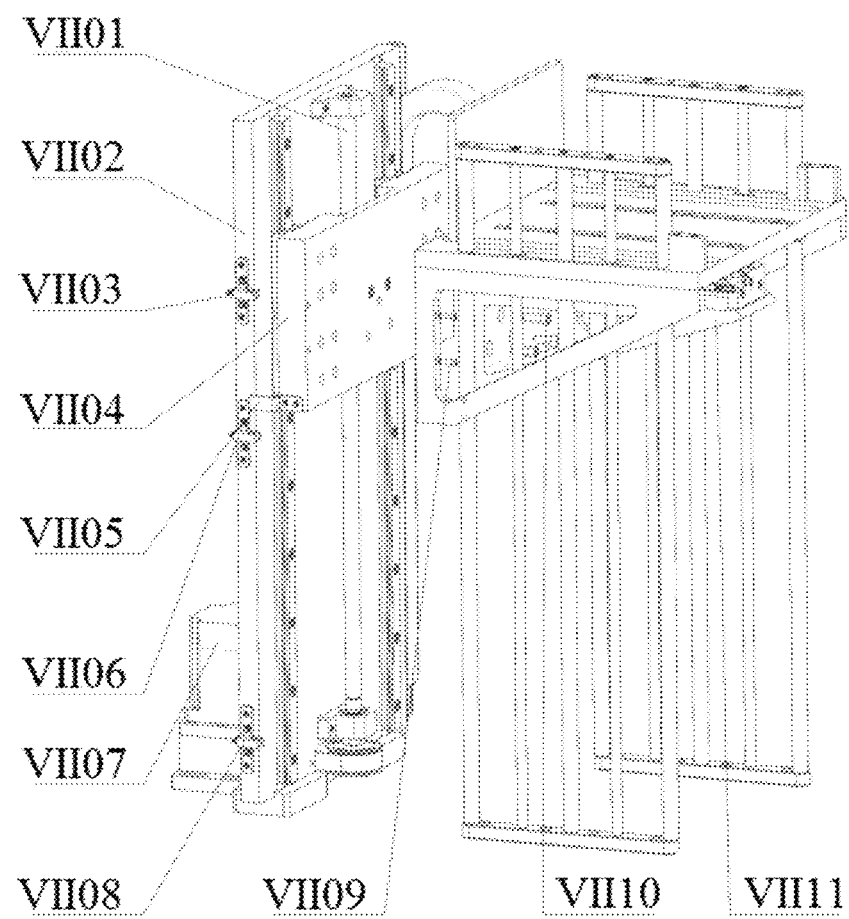
FIG. 8(a) is an exploded view of the tray lowering platform.
Figure 8B:
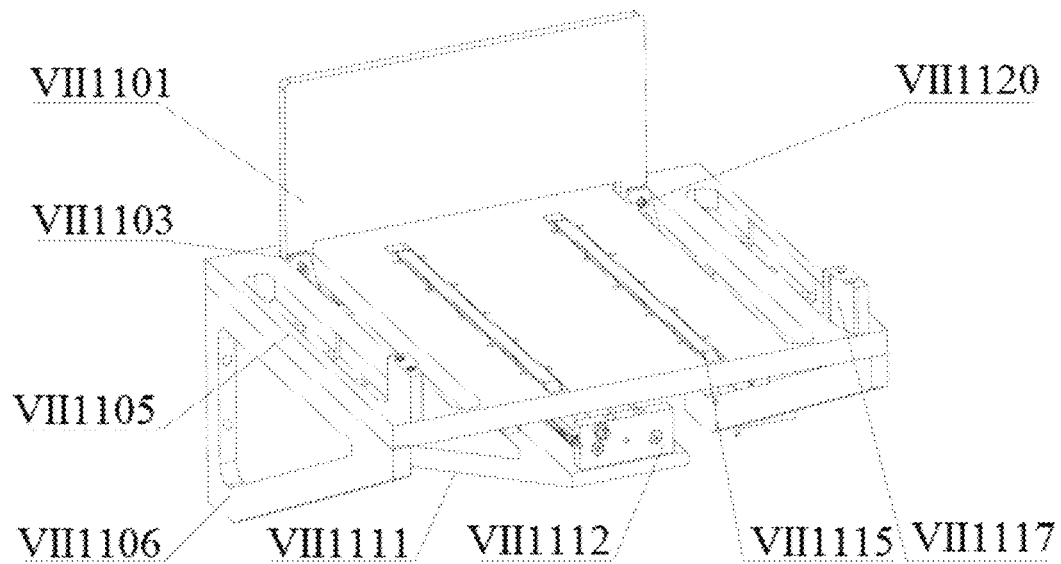
FIG. 8(b) is an axonometric view of a second tray supporting platform.
Figure 8C:
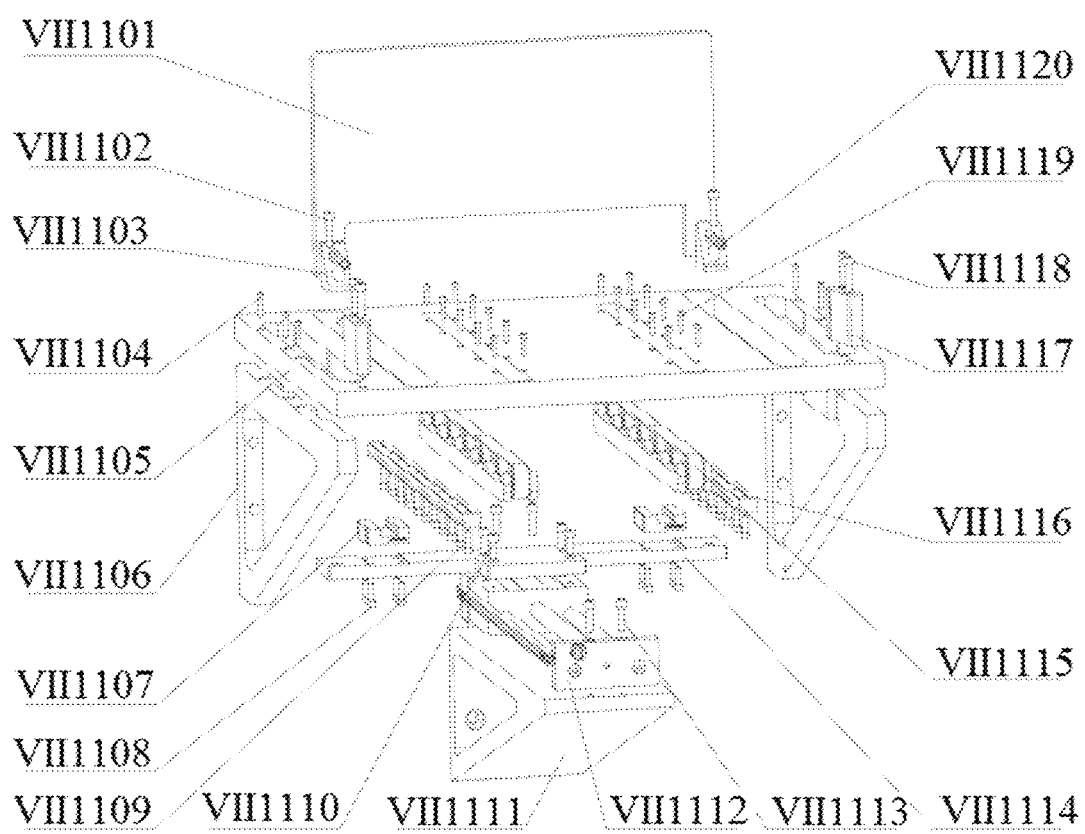
FIG. 8(c) is an exploded view of the second tray supporting platform.
Figure 8D:
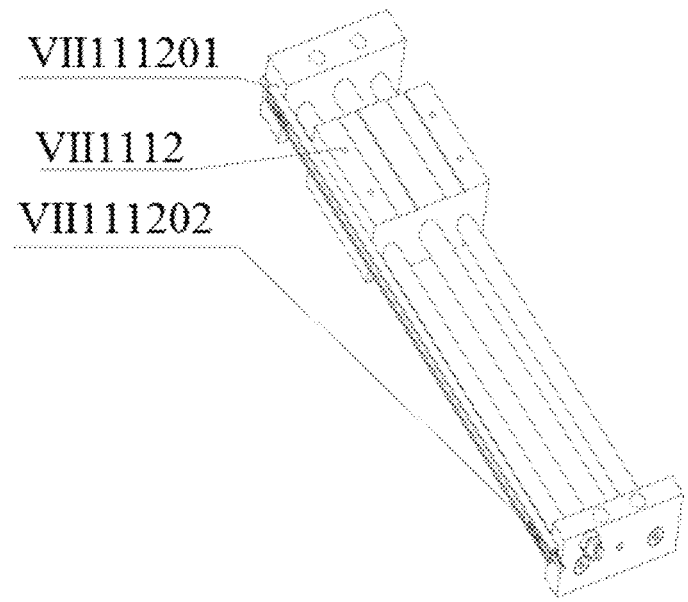
FIG. 8(d) is an axonometric view of a rodless cylinder sliding table.
Figure 8E:
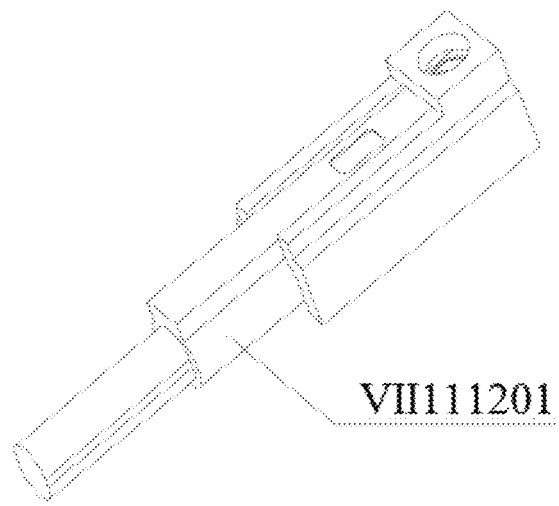
FIG. 8(e) is an axonometric view of a magnetic proximity sensor.
Figure 8F:
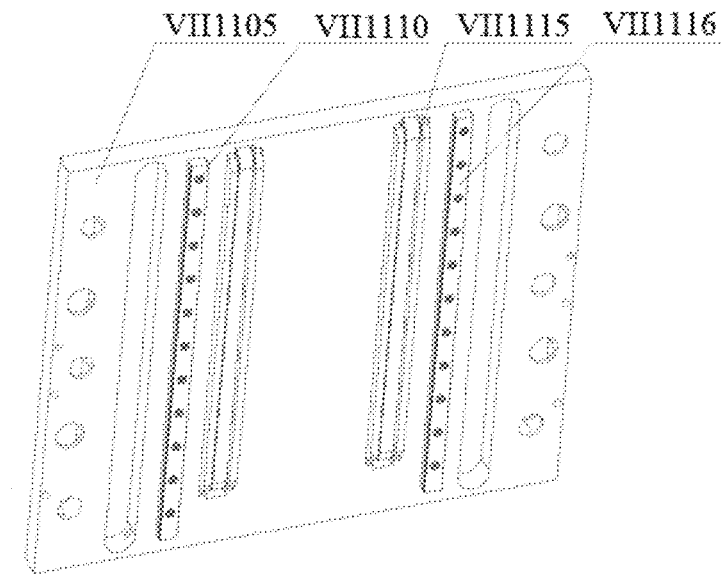
FIG. 8(f) is an axonometric view of assembling of a push guide rail, a tray supporting plate, and an anti-friction belt module.
Figure 8G:
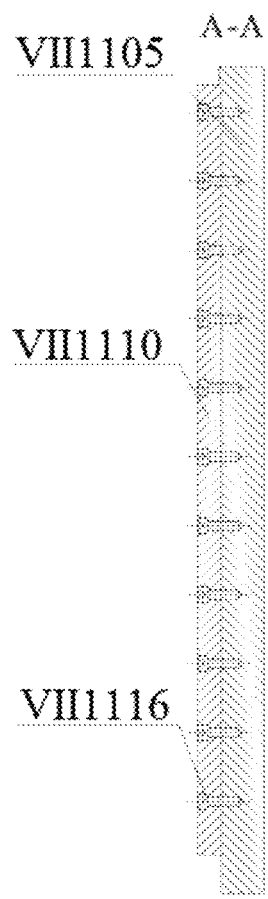
FIG. 8(g) is a cross-sectional view of A-A in FIG. 8(h)
Figure 8H:
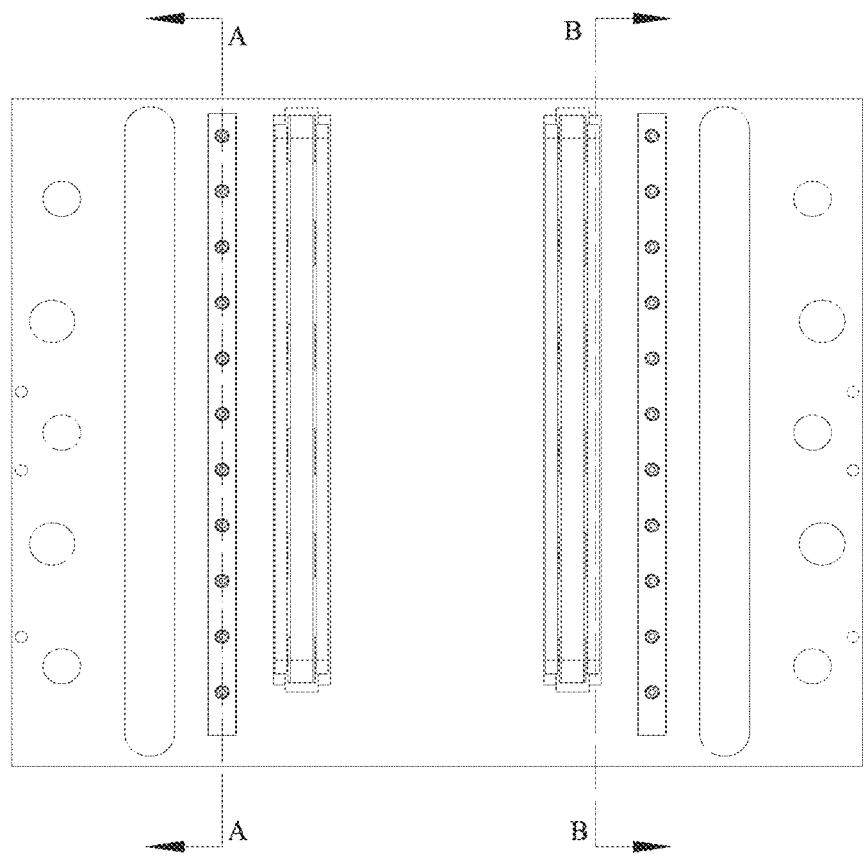
FIG. 8(h) is a planar graph of assembling of the push guide rail, the tray supporting plate, and the anti-friction belt module.
Figure 8I:
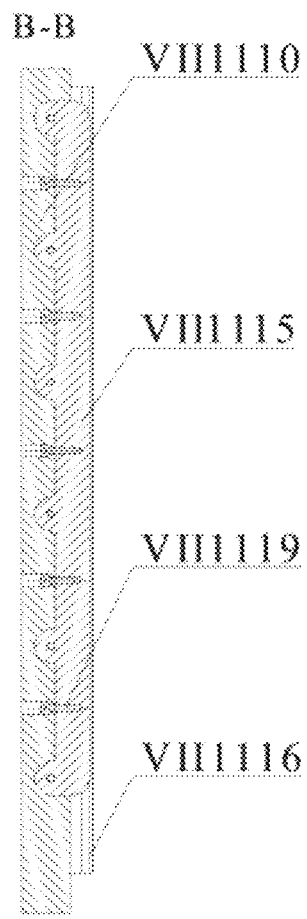
FIG. 8(i) is a cross-sectional view of B-B in FIGS. 8(h)
Figure 9:
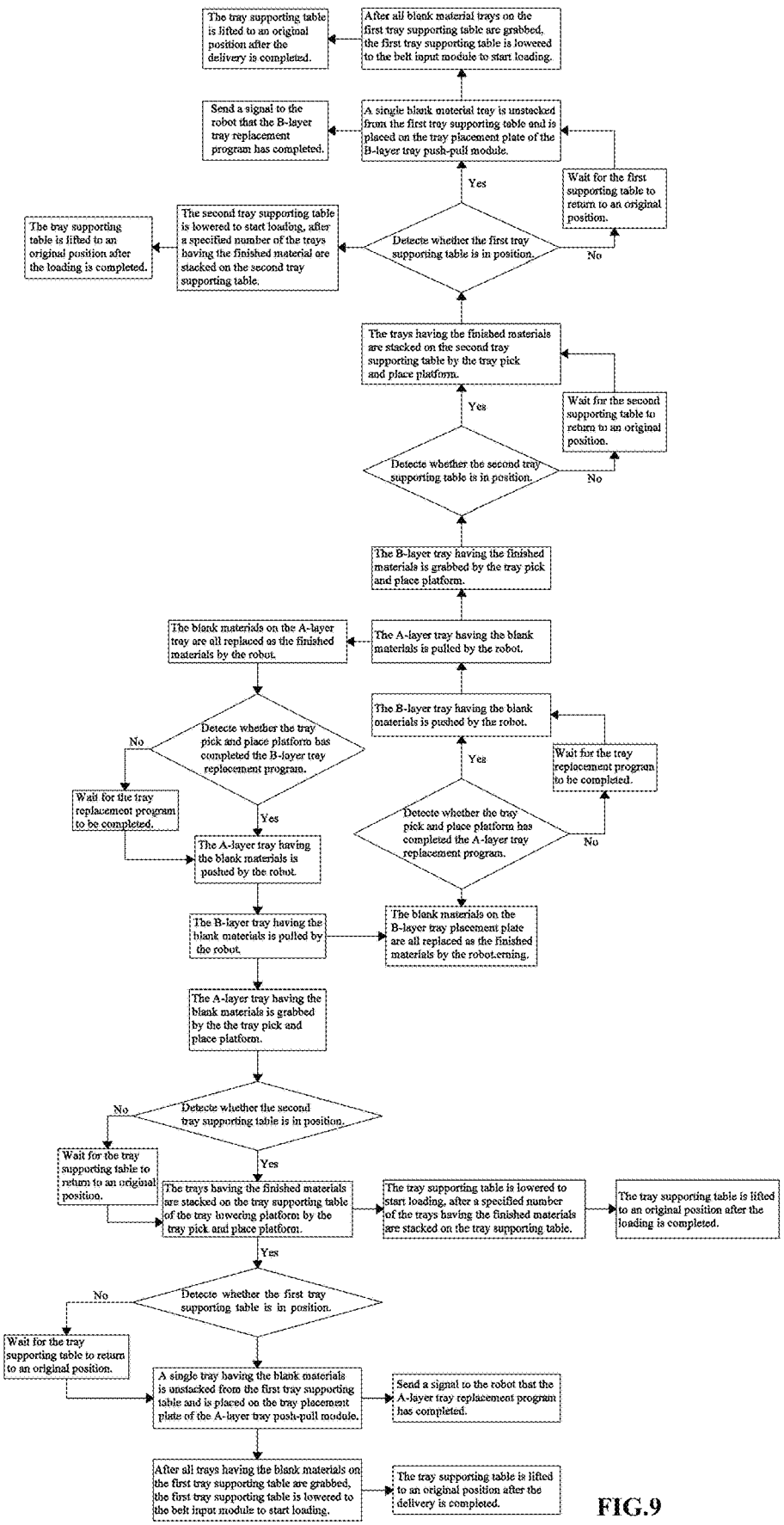
FIG. 9 is a working flowchart of a system.

Referring to FIG. 8 to FIG. 8(a), the tray lowering platform VII includes a second rear supporting plate VII02. A ball screw module VII01 is installed on the second rear supporting plate VII02, where the installation method is the same as the installation method in the tray lifting platform III. A U-shaped photoelectric sensor VII03, a U-shaped photoelectric sensor VII06 and a U-shaped photoelectric sensor VII08 are installed on a side of the second rear supporting plate VII02, where the installation method is the same as the installation method in the tray lifting platform III. The three sensors are disposed from top to bottom. A second trigger sheet VII05 is mounted on a side of a lowering connecting plate VII04, where the installation method is the same as the installation method in the tray lifting platform III. A second tray supporting table VII11 is fixed on the lowering connecting plate VII04 by hexagon socket head screws VII09 and VII10. Lateral triangular fixing plates VII1106 are fixed on the lowering connecting plate VII04 by hexagon socket head screws VII09, and a triangular table VII1111 is fixed on the lowering connecting plate VII04 by hexagon socket head screws VII10.

A U-shaped photoelectric sensor VII03 and a U-shaped photoelectric sensor VII08 are configured to restrain highest and lowest positions of the second tray supporting table VII11 to control delivery of the tray lowering platform. A U-shaped photoelectric sensor VII06 is located between the U-shaped photoelectric sensor VII03 and the U-shaped photoelectric sensor VII08 to detect whether the number of trays stacked on the second tray supporting table VII11 is reached a specified number and detect whether to start delivery. The number of trays output from the system at a time can be controlled by changing the mounting position of the U-shaped photoelectric sensor VII06.

Referring to FIG. 8(b) to FIG. 8(i), one end of a triangular connecting block VII1103 is fixed on a push plate VII1101 by a hexagon socket head screw VII1120, and the other end of a triangular connecting block VII1103 is fixedly connected with a T-shaped plate VII1114 by a hexagon socket head screw VII1102. The push plate VII1101 and the T-shaped plate VII1114 are fixedly connected at ninety degrees by the triangular connecting blocks VII1103. Lateral triangular fixing plates VII1106 are fixed to a lower part of a tray supporting plate VII1105 by hexagon socket head screws VII1104. Push sliding blocks VII1107 are fixedly connected with the T-shaped plate VII1114 by hexagon socket head screws VII1108. Push guide rails VII1116 are fixed to a lower part of a second tray supporting plate VII1105 by hexagon socket head screws VII1109. A triangular table VII1111 is arranged on the a lower part of the second tray supporting plate VII1105. A rodless cylinder sliding table VII1112 is fixed on the triangular table VII1111 by hexagon socket head screws VII1113.

A middle of the T-shaped plate VII1114 is fixed on the rodless cylinder sliding table VII1112 by hexagon socket head screws VII1110, and two sides of the T-shaped plate VIII1114 are provided with the push sliding block VII1107 by hexagon socket head screws VII1108. Anti-friction belt modules VII1115 are fixed to a lower part of the tray supporting plate VII1105 by hexagon socket head screws VII1119, and an upper surface of each anti-friction belt module VII1115 is higher than an upper surface of the second tray supporting plate VII1105. Transitional straightening blocks VII1117 are fixedly connected with the second tray supporting plate VII1105 by hexagon socket head screws VII1118.

The triangular table VII1111 is configured to support the rodless cylinder sliding table VII1112. The rodless cylinder sliding table VII1112 is fixedly connected with the push plate VII1101 by the T-shaped plate VII1114 and the triangular connecting blocks VII1103. The rodless cylinder sliding table VII1112 drives the push plate VII1101 to push the stacked tray assembly I from the second tray supporting VII11 to the belt output module II05. The rodless cylinder sliding table VII1112 is embedded with magnetic proximity sensors VII111201 and VII111202 which transmit position information of the push plate VII1101 to the computer in time. The push sliding blocks VII1107 and the push guide rails VII1116 cooperate with each other to play roles of supporting, guiding and friction reduction during a reciprocating motion of the push plate. In a process that the stacked tray assembly I is pushed out from the second tray supporting plate VII1105 to the belt output module II05, the anti-friction belt modules VII1115 can reduce contact and friction between the stacked tray assembly I and the second tray supporting table VII11, and sliding friction is converted into rolling friction, which further ensure that the stacked tray assembly is pushed out successfully, greatly reduces a friction on the stacked tray assembly, reduces wear of the tray and prolongs the service life of the trays. In a process of pushing out of the stacked tray assembly, transitional straightening blocks VII1117 installed at an outlet of the tray supporting plate can play roles of straightening and locating to improve the stability of the output of the stacked tray assembly.

It should be noted that the materials can be cutters or other workpieces.

Specific working process is as follow.

Figure 7:
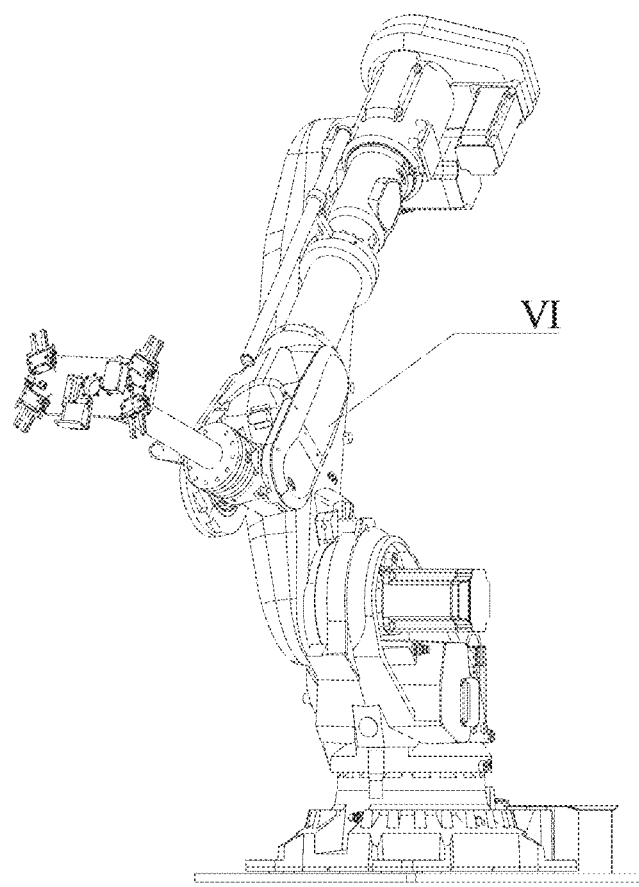
FIG. 7 is an axonometric view of a robot.

Referring to FIG. 6 to FIG. 7, the double layer delivery table V includes an upper layer tray push-pull module V02 and a lower layer tray push-pull module V05. After a production cycle, the robot VI replaces all blank materials on the tray of the A-layer tray placement plate into finished materials, and then the computer may detect whether the tray pick and place platform IV has replaced the blank material tray on the B-layer tray placement plate that is previously pushed out into finished material tray via a tray replacement program. The computer waits if the replacement is not completed; and the tray pick and place platform IV may send a signal to the computer after the replacement is completed. After receiving the signal, the tray with the finished materials is immediately pushed out by the A-layer tray push-pull module controlled by the computer. After the finished material tray is completely pushed out, the magnetic proximity sensor V0208 or the magnetic proximity sensor V0505 may send a signal to the computer, and then the computer controls the B-layer tray push-pull module to pull back the tray with the blank materials. After the tray with the blank materials is pulled back to a specified position, the magnetic proximity sensor V0203 or the magnetic proximity sensor V0511 may send a signal to the computer. Then the computer may recognize that a new batch of blank material trays are in place, control the robot VI to work on them, and control the tray pick and place platform IV to execute the tray replacement program on newly pushed finished material trays to replace the tray with the finished materials into the tray with the blank materials.

Figure 5O:
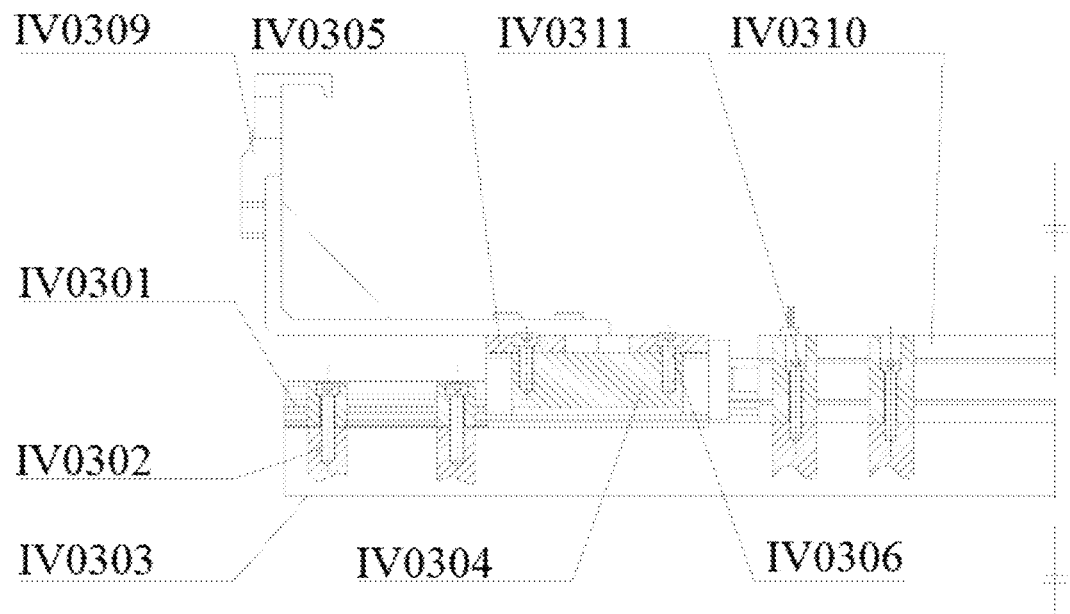
FIG. 5(o) is a partially cross-sectional front view of the manipulator.
Figure 5P:
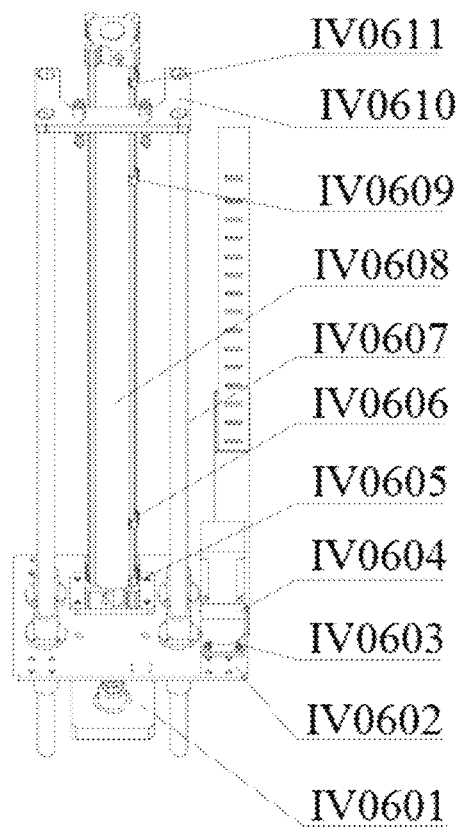
FIG. 5(p) is an axonometric view of a Z-axis directional displacement module.
Figure 5Q:
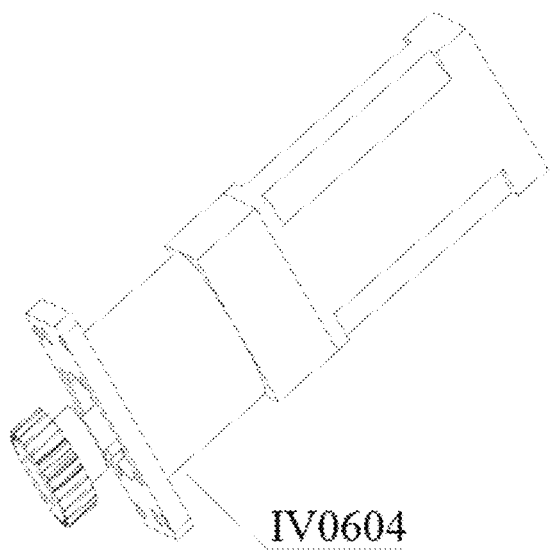
FIG. 5(q) is an axonometric view of a third gear motor.
Figure 5R:
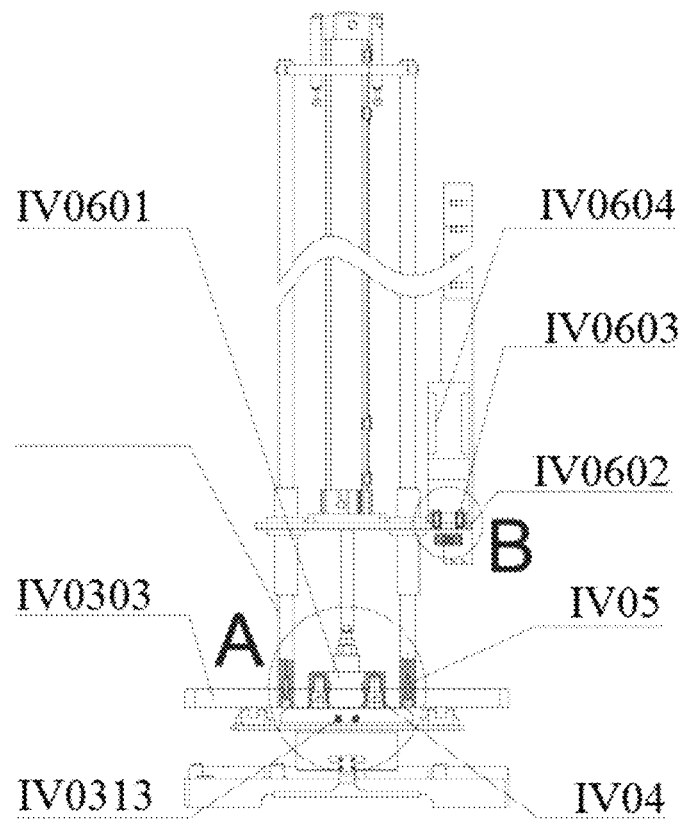
FIG. 5(r) is a partially cross-sectional front view of the Z-axis directional displacement module.
Figure 5S:
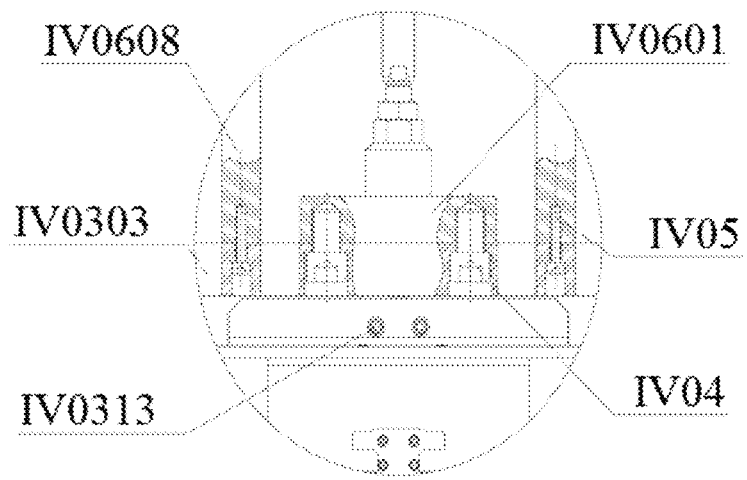
FIG. 5(s) is a partially enlarged view of a portion A in FIG. 5(r)
Figure 5T:
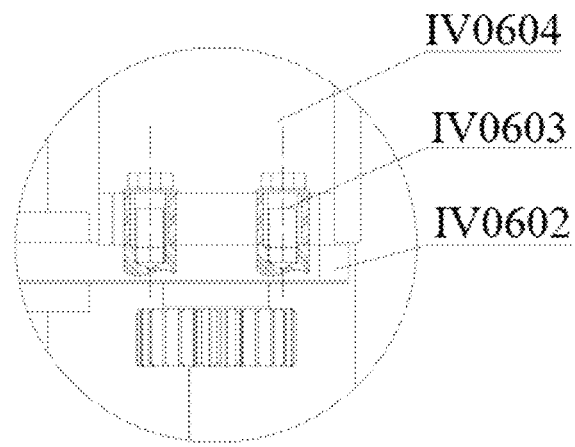
FIG. 5(t) is a partially enlarged view of a portion B in FIG. 5(r)

Referring to FIG. 3 and FIG. 5 to FIG. 5(o), after the robot III replaces the blank materials on the tray I01 into the finished materials, the computer firstly controls the double layer delivery table V to push out this tray, and then controls the tray pick and place platform IV to execute the tray replacement program. The computer controls the manipulator IV03 to move to a position above the table V, and then determines, according to the signal sent by the magnetic proximity sensor V0208 or the magnetic proximity sensor V0505 of the table V, whether to execute the tray replacement program on the upper layer push-pull module V02 or the lower layer tray push-pull module V05. When the tray replacement program needs to be executed on the upper layer tray push-pull module V02, the computer controls the piston of the cylinder IV0608 to descend to a position of the magnetic proximity sensor IV0606. Similarly, when the tray replacement program needs to be executed on the lower layer tray push-pull module V05, the piston of the cylinder IV0608 is lowered to the position of the magnetic proximity sensor IV0605. When the piston of the cylinder IV0608 reaches a specified position, the double guide rod cylinder IV0310 turns off the manipulator IV03 and clamps the tray. After a clamping is completed, the magnetic proximity sensor IV031002 transmits a signal to the computer. Next, the computer controls the piston of the cylinder IV0608 to be lifted to a detection position of the magnetic progressive sensor IV0611, and then the computer controls the manipulator IV03 and the finished material tray to move to a position above the tray lowering platform VII for stacking. Before stacking, the computer may use the diffuse reflection sensor II04 on the tray input and output platform II to detect whether there is an entity in front of it that can support the tray to be landed. After a specified number of finished material trays are stacked on the second tray supporting table VII11, the tray lowering table may enable the second tray supporting table VII11 to move down to the belt output module II05 and start to execute a delivery program, and at this time, an accident may occur if the manipulator IV03 is loosened. When the diffuse reflection sensor II04 detects that there is no supporting entity in front, the manipulator IV03 and the finished material tray remain at original positions and wait for a signal. When the diffuse reflection sensor II04 detects that there is a supporting entity in front, the computer may control the piston of the cylinder IV0608 to be lowered to a detection position of the magnetic proximity sensor IV0609, and then turn on the manipulator IV03 to place the finished material tray on the second tray supporting table VII11.

After the stacking is completed, the magnetic proximity sensor IV031001 transmits a signal to the computer, and then the computer controls the piston of the cylinder piston to be lifted to the detection position of the magnetic progressive sensor IV0611, and moves the manipulator IV03 to a position above the tray lifting platform III for unstacking. Before unstacking, whether there is a tray at a grabbing position may be firstly detected by the diffuse reflection sensor II01. When it is detected that there is a tray, the tray pick and place platform IV may grab the tray, otherwise, the tray pick and place platform IV may not execute the grabbing program. After all the trays on the first tray supporting table III10 are removed, the computer may control the first tray supporting table III10 to be lowered to a position of the belt input module II02, and start the feeding program. At this time, if the tray pick and place platform IV comes to grab the tray, a phenomenon of "grabbing nothing" will occur. When the computer detects the presence of the tray, the piston of the cylinder IV0608 descends to a detection position of the magnetic proximity sensor IV0606, then the manipulator IV03 clamps the blank material tray, and then the magnetic proximity sensor IV031002 transmits a signal to the computer. The computer controls the piston of the cylinder IV0608 to be lifted to a detection position of the magnetic proximity sensor IV0611, moves the manipulator IV03 and the blank material tray to a position above the double layer delivery table V, and places the blank material tray into the upper layer tray push-pull module V02 or the lower layer tray push-pull module V05. Then the piston of the cylinder moves up to the position of the magnetic proximity sensor IV0611, and the magnetic proximity sensor IV0611 sends a completion signal of the tray replacement program to the computer.

Referring to FIG. 3 to FIG. 3(b) and FIG. 8-FIG. 8(d), when the tray pick and place platform IV stacks the finished material trays on the second supporting table VII11, stacked trays are just located in front of the diffuse reflection sensor II03. At this time, a light beam emitted by a transmitter of the diffuse reflection sensor II03 is refracted to a receiver via the trays in front of it, and the diffuse reflection sensor II03 transmits a signal to the computer. The computer controls the stepping motor VII07 to start to drive the second tray supporting table VII11 to move downward by the ball screw module VII01. When the second tray supporting table VII11 moves down one tray height, the detection entity in front of the diffuse reflection sensor II03 disappears, and the computer controls the stepping motor VII07 to be self-locked and waits for next signal stimulation. The above processes are repeated, and the second tray supporting table VII11 continuously moves downward. When the second trigger sheet VII05 reaches a detection position of the U-shaped photoelectric sensor VII06, the computer starts to execute the delivery program. The computer controls the second tray supporting table VII11 to be lowered. When the second trigger sheet VII05 reaches a detection position of the U-shaped photoelectric sensor VI108, the computer may simultaneously execute three programs: controlling the stepping motor VII07 to be self-locked; controlling the rodless air cylinder sliding table VII1112 to drive the push plate VII1101 to push the stacked tray assembly I with the finished materials to the outside; and starting the belt output module II05.

When the finished material stacked tray assembly I is transported to a detection position of the diffuse reflection sensor II06, the stacked tray assembly I with the finished materials at this time has completely left the second tray supporting table VII11, and then the rodless cylinder sliding VII1112 resets the push plate VII1101. After the push plate VII1101 is successfully reset, the magnetic proximity sensor VII111201 transmits a signal to the computer, and then the computer controls the second tray supporting table VII11 to be lifted. When the second trigger sheet VII05 reaches a detection position of the U-shaped photoelectric sensor VII03, the computer controls the stepping motor VII07 in time to be self-locked. At this time, the diffuse reflection sensor II04 detects the presence of the second tray supporting plate VII1105, there is an entity in front of the second tray supporting plate VII1105 that can support the trays to be landed, and the tray pick and place platform IV can stack the finished material trays. When the order quantity changes, a stacking quantity of the trays in the stacked tray assembly output by the tray lowering platform VII at a time may be changed by adjusting the installation height of the U-shaped photoelectric sensor VII06.

Figure 4O:
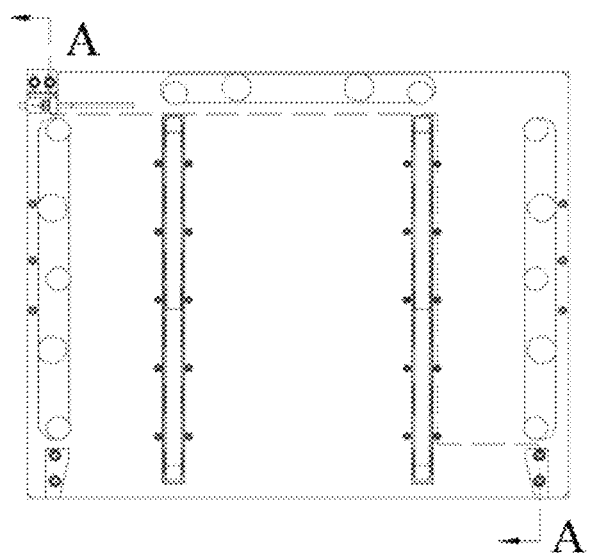
FIG. 4(o) is a cross-sectional view of A-A of the first tray supporting table.

Referring to FIG. 3 to FIG. 4(o), after the tray in the tray lifting platform III is grabbed and lifted by the tray pick and place platform IV, the detection entity in front of the diffuse reflection sensor II01 disappears, the light beam emitted by the transmitter in the sensor cannot be reflected by the front entity to the receiver, and the diffuse reflection sensor II01 transmits a signal to the computer. The computer controls the stepping motor III01 to start to drive the lifting connecting plate III14 and the first tray supporting table III10 to be lifted by the ball screw module II104. After the first tray supporting table III10 is lifted one tray height, a next tray to be grabbed is lifted to a position, that is, in front of the diffuse reflection sensor II01 to be grabbed. At this time, the sensor detects the front detection entity. The computer controls the stepping motor III01 to be self-locked in time, and waits for the tray pick and place platform IV for grabbing.

After the above procedures are repeated, the first tray supporting table III10 continues to rise. After the last tray is taken away, the first tray supporting table III10 continues to rise according to the above control process. When the first trigger sheet III05 is lifted to a detection position of the first U-shaped photoelectric sensor III20, the computer starts to execute the loading program. The computer may change a turning direction of the stepping motor III01 to drive the first tray supporting table III10 and the first trigger sheet III05 to move downward. When the first trigger sheet III05 is lowered to the U-shaped slot of the second U-shaped photoelectric sensor III23 for detection, the computer may recognize that the first tray supporting table III10 has reached a specified loading position and control the stepping motor in time to be self-locked, and control the belt input module II02 and the belt auxiliary module III1006 to be started at the same time to input the stacked tray assembly I to a specified position in the first tray supporting table III10.

When the stacked tray assembly I is transported to the specified position, the diffuse reflection sensor III1012 sends a signal to the computer. The computer controls the belt input module II02 and the belt auxiliary module III1006 to be stoped, and controls the stepping motor III01 to be started at the same time, so that the first tray supporting table III10 drives the stacked tray assembly I that has just been input to be lifted. When the tray is lifted to the grabbing position, the diffuse reflection sensor II01 may transmit a signal to the computer. The computer controls the stepping motor III01 in time to be self-locked, and then the uppermost tray in the stacked tray assembly I may remain at the grabbing position and wait for the tray pick and place platform IV for grabbing.

According to a calculating formula of a ball screw:

$$F_a = F + \mu m g \tag{1}$$

if it is desired that a screw module smoothly drives the tray supporting table and the stacked tray assembly to move up and down, a driving torque $T_a$ of the screw module is at least $$T_a = (F_a * I)/2\pi * n_1 \tag{2}$$

Where $T_a$ is the driving torque, kgf/mm; $F_a$ is a total axial load of the screw, N; I is a lead of the screw, mm; $n_1$ is forward efficiency of screw feeding; F is an axial cutting force of the screw, N; μ is comprehensive friction coefficient of a guide piece; m is a weight of a moving object which is the sum of a weight of stacked tray assembly and tray supporting table, kg; and g is gravity coefficient.

The above description is merely preferred embodiments of the present disclosure and is not intended to limit the present disclosure. For those skilled in the art, the present disclosure may have various modifications and variations. It is intended that any modifications, equivalent replacement, improvement and so on within the spirit and scope of the present disclosure should be included in the protection scope of the present disclosure.

What is claimed is:

1. An automatic tray loading system, comprising:
   a stacked tray assembly, comprising at least one tray which is stacked up, and the at least one tray being provided with several locating slots which are configured to limit positions of materials;
   a tray lifting platform, comprising a first tray supporting table which is configured to support the stacked tray assembly and the first tray supporting table being connected with a first elevating mechanism;
   a delivery table, comprising tray placement plates, each of the tray placement plates being provided with a first groove which is configured to place the at least one tray, and each of the tray placement plates being connected with a linear driving mechanism; and
   a tray pick and place platform, being supported by a frame and having a working region covers the tray lifting platform and the delivery table, the tray pick and place platform comprising a manipulator which is connected with a multidimensional motion mechanism and is opened or closed to realize grabbing and releasing of the at least one tray;
   wherein an upper surface of the at least one tray is provided with at least one locating block, and a lower surface of the at least one tray is provided with at least one locating slot matching a locating block of a next tray; a height of the at least one locating block is less than a depth of the at least one locating slot, and a length of the locating at least one block is less than a length of the at least one locating slot; an inner side part of a material slot is steplike to adapt to the materials with different sizes; and a grabbing slot for grabbing by the manipulator is provided at a side part of the at least one tray.

2. The automatic tray loading system according to claim 1, wherein the first elevating mechanism is a ball screw mechanism and is fixed on a first rear supporting plate; the first tray supporting table is connected with a sliding block in the ball screw mechanism by a connecting plate, an inner side of the first tray supporting table is provided with a first distance sensor connected with a computer; and the distance sensor is disposed in a manner of facing the inner side of the first tray supporting table to detect whether the at least one tray completely reach the first tray supporting table;
   a first elongated hole is provided in a width direction of the first tray supporting table; a first belt auxiliary module is arranged at the first elongated hole to reduce a friction force generated by the at least one tray moving to the first tray supporting table and further provide power for inputting of the stacked tray assembly; and
   two limit sensors at different heights are arranged at a side part of the first rear supporting plate and are connected with the computer; and a first trigger sheet is arranged at a side part of the first tray supporting table.

3. The automatic tray loading system according to claim 2, further comprising a tray lowering platform, wherein a structure of the tray lowering platform comprises a second tray supporting table; a second elevating mechanism is connected with the second tray supporting table and is mounted on a second rear supporting plate; a surface of the second tray supporting table is provided with a clamping slot; two sides of a bottom of a push plate pass through the clamping slot and are connected with a T-shaped plate; a moving mechanism is connected with a T-shaped plate; a fixed sliding block is provided on each of two sides of an upper surface of the T-shaped plate and is fixed with a guide rail mounted on the second tray supporting table; and a first proximity sensor is embedded to a lateral surface of the moving mechanism and is connected with the computer to transmit position information of the push plate to the computer;
   a second elongated hole is provided in a width direction of the second tray supporting table; a second belt auxiliary module is arranged at the second elongated hole to reduce a friction force of movement of the at least one tray on the second tray supporting table; and
   three limit sensors at different heights are arranged at a side part of the second rear supporting plate of the tray lowering platform and are connected with the computer; the limit sensors at a top and a bottom of the side part of the second rear supporting plate are configured to acquire a position signal of the second tray supporting table for the computer; the limit sensor at a middle of the side part of the second rear supporting plate has a changeable installation height on the second rear supporting plate, and is configured to detect whether to start to discharge the materials; a number of the at least one tray output from the automatic feeding system at a time is controlled by changing the installation height of the limit sensor at the middle of the side part of the second rear supporting plate; and a second trigger sheet is arranged at a side part of the second tray supporting table.

4. The automatic tray loading system according to claim 3, further comprising a tray input and output platform, wherein the tray input and output platform comprises a tray input module configured to convey the stacked tray assembly and a tray output module configured to output the stacked tray assembly; the tray input module is provided on a side of the tray lifting platform; the tray output module is arranged on a side of the tray lowering platform; a second distance sensor configured to detect whether the stacked tray assembly is completely output is arranged on a side of the tray output module; and the distance sensor is connected with the computer.

5. The automatic tray loading system according to claim 4, wherein the tray input and output platform further comprises a box-shaped frame body which is divided into two regions; one of the two regions is configured to support the tray input module, and an other of the two regions is configured to support the tray output module; an upper surface of the box-shaped frame body is provided with two openings; the tray lifting platform and the tray lowering platform respectively protrude from the two openings; a third distance sensor facing the tray lifting platform is arranged at one of the two openings, and two fourth distance sensors with different heights and facing the tray lowering platform are arranged at an other of the two openings; one of the two fourth distance sensors at a relatively low position is configured to detect whether an entity capable of supporting the at least one tray to be landed exists in front of the distance sensor; an other of the two fourth distance sensors at a relatively high position is configured to control stacking;

the third distance sensor on a side of the tray lifting platform is configured to detect whether the at least one tray to be grabbed exists in front thereof and control unstacking; all distance sensors are connected with the computer; and the computer is connected with the multi-dimensional motion mechanism to control unstacking and stacking of the at least one tray.

6. The automatic tray loading system according to claim 2, wherein the manipulator comprises a mounting plate which is provided with a third linear sliding rail; a bidirectional moving mechanism is provided through the mounting plate; two ends of the bidirectional moving mechanism are connected with hooks which are connected with a third sliding block arranged on the third linear sliding rail; the at least one tray is supported by the hooks at the two ends; a second proximity sensor is embedded to a surface of the bidirectional moving mechanism and is connected with the computer to detect an opened or closed state of the manipulator;

each of the hooks has a second groove so that each of the hooks is a grooved hook; and the second groove of the grooved hook is disposed facing the bidirectional moving mechanism.

7. The automatic tray loading system according to claim 2, wherein the multidimensional moving mechanism comprises X-axis directional displacement modules which are arranged on two sides of the retainer; a Y-axis directional displacement module is supported by the X-axis directional displacement modules on two sides; a Z-axis directional displacement module is supported by the Y-axis directional displacement module and passes through the Y-axis directional displacement module; and the manipulator is arranged below the Y-axis directional displacement module;

a structure of the X-axis directional displacement module is same as a structure of the Y-axis directional displacement module, each of which comprises a linear sliding rail which is provided with a sliding block; a rack is connected with a power piece and is fixed, to drive the sliding block to move along the linear sliding rail;

the Z-axis directional displacement module comprises a telescopic piece; an end part of the telescopic piece is provided with a connecting block which is connected with the manipulator; and an outer side of the telescopic piece is provided with a plurality of third proximity sensors having different heights and configured to confirm an extending position of the telescopic piece, and the third proximity sensors are connected with the computer.

8. The automatic tray loading system according to claim 3, wherein the delivery table is a double layer delivery table, and comprises two tray placement plates arranged on a table main body; the two tray placement plates move in a dislocation manner; each of the two tray placement plates is connected with the table main body by the linear driving mechanism; and fourth proximity sensors connected with the computer are arranged on a side of each linear driving mechanism to transmit position information of the at least one tray in the two tray placement plates to the computer in time;

or, a robot configured to transport the materials in the at least one tray is arranged on an other side of the delivery table relative to the tray lifting platform.

9. A method for using the automatic tray loading system according to claim 8, comprising the following contents:

detecting by the computer whether a tray pick and place platform has replaced at least one tray containing finished materials in a B-layer tray placement plate of the two tray placement plates that is previously pushed out with at least one tray containing blank materials, after the blank materials in a A-layer tray placement plate of the two tray placement plates in the delivery table are replaced with the finished materials; waiting until the replacement is completed; and pushing out the A-layer tray placement plate having the finished materials by the computer after the replacement is completed;

pulling back the B-layer tray placement plate having the blank materials by the computer after the A-layer tray placement plate is pushed in place; controlling by the computer the robot to operate the blank materials, after the at least one tray containing the blank materials is pulled back to a specified position, and a new batch of blank material is in position;

performing a tray replacement process on the A-layer tray placement plate by the tray pick and place platform; grabbing the at least one tray containing the finished materials on the A-layer tray placement plate by the tray pick and place platform; detecting by the computer whether the second tray supporting table in the tray lowering platform is in place, if no, waiting until the second tray supporting table is in place, and if yes, stacking the at least one tray containing the finished materials onto the tray lowering platform;

controlling, by the computer, the tray pick and place platform to unstack a single tray containing blank materials from the tray lifting platform, transporting the single tray containing the blank materials to tray placement plate of an A-layer tray push-pull module, and sending a signal to the robot that the tray replacement process has completed;

pushing out the B-layer tray placement plate having finished material, after the blank materials on the B-layer tray placement plate are replaced with the finished materials by the robot; pulling back the A-layer tray placement plate having the blank materials for continuing to operate, and performing the tray replacement process on the at least one tray on the B-layer tray placement plate by the tray pick and place platform, repeating above operation;

lowering the first tray supporting table to start feeding, after all trays containing the blank materials on the tray lifting platform are grabbed; inputting a new batch of stacked tray assembly with blank materials to the tray lifting platform, lifting the first tray supporting table to a first original position after the feeding is completed, and sending a feeding completion signal to the computer; and lowering the second tray supporting table to start feeding, after a predetermined number of trays containing the finished materials are stacked on the tray lowering platform, delivering a stacked tray assembly with the finished materials, lifting the second tray supporting table to a second original position after the delivery is completed, and sending a delivery completion signal to the computer.

* * * * *